(12) United States Patent
Park et al.

(10) Patent No.: US 8,664,633 B2
(45) Date of Patent: Mar. 4, 2014

(54) NON-VOLATILE MEMORY DEVICES HAVING RESISTANCE CHANGEABLE ELEMENTS AND RELATED SYSTEMS AND METHODS

(75) Inventors: Heung-Kyu Park, Gumi-si (KR); In-Sun Park, Seoul (KR); In-Gyu Baek, Seoul (KR); Byeong-Chan Lee, Yongin-si (KR); Sang-Bom Kang, Seoul (KR); Woo-Bin Song, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 181 days.

(21) Appl. No.: 13/220,777

(22) Filed: Aug. 30, 2011

(65) Prior Publication Data

US 2012/0112156 A1 May 10, 2012

(30) Foreign Application Priority Data

Nov. 10, 2010 (KR) ........................ 10-2010-0111551

(51) Int. Cl.
*H01L 29/06* (2006.01)

(52) U.S. Cl.
USPC ................. 257/5; 257/4; 257/296; 257/927; 257/304; 257/E45.002; 438/396; 438/482

(58) Field of Classification Search
None
See application file for complete search history.

(56) References Cited

U.S. PATENT DOCUMENTS

| | | | |
|---|---|---|---|
| 4,757,542 A * | 7/1988 | Neahr et al. ................. | 704/274 |
| 6,236,059 B1 | 5/2001 | Wolstenholme et al. | |
| 6,420,215 B1 | 7/2002 | Knall et al. | |
| 6,579,760 B1 | 6/2003 | Lung | |
| 6,642,603 B1 | 11/2003 | Knall | |
| 7,700,935 B2 | 4/2010 | Kim et al. | |
| 7,910,914 B2 | 3/2011 | Tanaka et al. | |
| 8,124,968 B2 | 2/2012 | Koo et al. | |
| 2002/0081833 A1 | 6/2002 | Li et al. | |
| 2004/0002186 A1 | 1/2004 | Vyvoda et al. | |
| 2005/0158950 A1 | 7/2005 | Scheuerlein et al. | |
| 2006/0110877 A1 | 5/2006 | Park et al. | |
| 2006/0203541 A1 | 9/2006 | Toda | |
| 2006/0237756 A1 | 10/2006 | Park et al. | |
| 2007/0190722 A1 | 8/2007 | Herner | |

(Continued)

FOREIGN PATENT DOCUMENTS

| JP | 2008-181978 | 8/2008 |
|---|---|---|
| JP | 2010-114376 | 5/2010 |
| KR | 1020080048314 | 6/2008 |

*Primary Examiner* — Yasser A Abdelaziez
(74) *Attorney, Agent, or Firm* — Myers Bigel Sibley & Sajovec, P.A.

(57) ABSTRACT

A non-volatile memory device may include a first wordline on a substrate, an insulating layer on the first wordline, and a second wordline on the insulating layer so that the insulating layer is between the first and second wordlines. A bit pillar may extend adjacent the first wordline, the insulating layer, and the second wordline in a direction perpendicular with respect to a surface of the substrate, and the bit pillar may be electrically conductive. In addition, a first memory cell may include a first resistance changeable element electrically coupled between the first wordline and the bit pillar, and a second memory cell may include a second resistance changeable element electrically coupled between the second wordline and the bit pillar. Related methods and systems are also discussed.

20 Claims, 37 Drawing Sheets

(56) References Cited

U.S. PATENT DOCUMENTS

| | | |
|---|---|---|
| 2008/0123390 A1 | 5/2008 | Kim et al. |
| 2008/0175032 A1 | 7/2008 | Tanaka et al. |
| 2008/0265235 A1 | 10/2008 | Kamigaichi et al. |
| 2009/0141547 A1 | 6/2009 | Jin et al. |
| 2009/0261314 A1 | 10/2009 | Kim et al. |
| 2009/0321878 A1* | 12/2009 | Koo et al. ............ 257/536 |
| 2010/0117047 A1 | 5/2010 | Tanaka et al. |
| 2011/0204315 A1 | 8/2011 | Baek et al. |

* cited by examiner

NON-VOLATILE MEMORY DEVICES HAVING RESISTANCE CHANGEABLE ELEMENTS AND RELATED SYSTEMS AND METHODS

CROSS-REFERENCE TO RELATED APPLICATION

This application claims priority under 35 U.S.C. §119 to Korean Patent Application No. 10-2010-0111551 filed on Nov. 10, 2010, the disclosure of which is hereby incorporated by reference in its entirety.

BACKGROUND

1. Field

Embodiments of inventive concepts relate to semiconductor devices having pluralities of vertically stacked memory cells, and methods of fabricating the same.

2. Description of Related Art

To reduce the sizes of non-volatile memory devices and improve performance, various methods of vertically stacking a plurality of memory cells on a substrate are being studied.

SUMMARY

Embodiments of inventive concepts may provide non-volatile memory devices capable of reducing degradation of a resistance changeable element and reducing leakage currents.

Embodiments of inventive concepts may also provide electronic systems adopting a non-volatile memory device capable of reducing degradation of a resistance changeable element and reducing leakage currents.

Embodiments of inventive concepts may also provide methods of fabricating non-volatile memory devices capable of reducing degradation of a resistance changeable element and reducing leakage currents.

Inventive concepts will not be limited to the embodiments mentioned herein, and other embodiments which are not mentioned will be clearly understood by those skilled in the art with reference to the following descriptions.

In accordance with some aspects of inventive concepts, a non-volatile memory device is provided. The device may include bit lines and isolation layers formed on a substrate. A buffer layer may be provided on the bit lines and the isolation layers. A plurality of insulating layers and a plurality of wordlines are alternatingly disposed on the buffer layer. A bit pillar is connected to the bit line through the insulating layers, the wordlines, and the buffer layer, and the bit pillar has a first silicon layer containing impurities at a first concentration. A plurality of memory cells are disposed between the wordlines and the bit pillar. Each memory cell includes a resistance changeable element disposed adjacent to the wordline and a schottky diode disposed adjacent to the bit pillar. The schottky diode includes a second silicon layer containing impurities at a second concentration lower than the first concentration, and a metal silicide layer.

In some embodiments, the metal silicide layer may be confined between the insulating layers.

In other embodiments, the second silicon layer may include a selective epitaxial growth layer.

In still other embodiments, the second silicon layer may be confined between the insulating layers.

In yet other embodiments, the bit pillar may include a self-aligned recess region disposed between the insulating layers. The second silicon layer may be formed in the recess region. The second silicon layer may extend from the recess region to be confined between the insulating layers.

In yet other embodiments, the second silicon layer may surround a sidewall of the first silicon layer.

In yet other embodiments, the wordlines may include a low-temperature conductive layer having a lower deposition temperature than a critical degradation temperature of the resistance changeable element. The wordlines may include an Ru layer and/or a W layer.

In yet other embodiments, the resistance changeable element may include a transition metal oxide (TMO), a phase change material layer, a solid electrolyte layer and/or a polymer layer.

In yet other embodiments, the resistance changeable element may extend above and under the wordlines.

In yet other embodiments, the bit pillar may include a metal pillar. The first silicon layer may surround a sidewall of the metal pillar.

In yet other embodiments, each memory cell may include an electrode disposed between the metal silicide layer and the resistance changeable element. The electrode may include a metal oxide layer with the same metal element as contained in the metal silicide layer.

In accordance with other aspects of the inventive concepts, a non-volatile memory device may be provided. The device may include a plurality of insulating layers and a plurality of wordlines alternatingly and repeatedly stacked on a substrate. A bit pillar may pass vertically through the insulating layers and the wordlines and may have a semiconductor layer containing N-type or P-type impurities. A plurality of memory cells are disposed between the wordlines and the bit pillar. Each memory cell includes an intrinsic semiconductor layer formed on the semiconductor layer, a metal silicide layer formed on the intrinsic semiconductor layer, and a resistance changeable element disposed between the metal silicide layer and the wordlines.

In accordance with still other aspects of inventive concepts, a non-volatile memory device may be provided. The device may include a first insulating layer formed on a substrate. An insulating barrier having first and second sidewalls facing each other is disposed on the first insulating layer. Wordlines and insulating layers, which are adjacent to the first sidewall and alternatingly stacked on the first insulating layer, are provided. A bit pillar passes through the insulating barrier to vertically divide the insulating barrier is disposed. Memory cells are disposed between the wordlines and the bit pillar. Each memory cell includes a metal silicide layer and a resistance changeable element.

In other embodiments, each memory cell may include an interfacial layer between the metal silicide layer and the bit pillar. The bit pillar may include a first semiconductor layer containing impurities at a first concentration. The interfacial layer may include a second semiconductor layer containing impurities at a second concentration lower than the first concentration.

In accordance with yet further aspects of inventive concepts, a non-volatile memory device may be provided. The device includes a plurality of insulating layers and a plurality of wordlines alternatingly stacked on a substrate. A bit pillar passes vertically through the insulating layers and the wordlines. A plurality of memory cells are disposed between the wordlines and the bit pillar. Each of the wordlines includes a first semiconductor layer containing impurities at a first concentration. Each memory cell includes a resistance changeable element disposed adjacent to the bit pillar and a schottky diode disposed adjacent to the wordline. The schottky diode includes a second semiconductor layer containing impurities at a second concentration lower than the first concentration, and a metal silicide layer.

In other embodiments, the wordlines may include a polysilicon layer.

In accordance with yet other aspects of inventive concepts, an electronic system may be provided. The electronic device includes a microprocessor, and a non-volatile memory device disposed adjacent and electrically connected to the microprocessor. The non-volatile memory device includes bit lines formed on a substrate. A plurality of insulating layers and a plurality of wordlines are alternatingly stacked on the bit lines. A bit pillar passes vertically through the insulating layers and the wordlines to connect to the bit line, and the bit pillar has a first silicon layer containing impurities at a first concentration. A plurality of memory cells are disposed between the wordlines and the bit pillar. Each memory cell includes a resistance changeable element disposed adjacent to the wordline and a schottky diode disposed adjacent to the bit pillar. The schottky diode includes a second silicon layer containing impurities at a second concentration lower than the first concentration, and a metal silicide layer.

In accordance with yet other aspects of the inventive concepts, a method of fabricating a non-volatile memory device may be provided. The method includes forming a plurality of insulating layers sequentially stacked on a substrate. A bit pillar is formed passing through the insulating layers and having a first silicon layer containing impurities at a first concentration. A plurality of memory cells connected to the bit pillar are formed. Wordlines are formed between the insulating layers. Each memory cell is formed between the bit pillar and the wordlines. The formation of the memory cells includes forming a second silicon layer containing impurities at a second concentration lower than the first concentration on the first silicon layer. A metal silicide layer is formed on the second silicon layer. A resistance changeable element is formed on the metal silicide layer.

In other embodiments, the wordlines may be formed of low-temperature conductive layers having a lower deposition temperature than a critical degradation temperature of the resistance changeable element.

In still other embodiments, the wordlines may be formed at a process temperature of 400° C. or less.

In yet other embodiments, the formation of the memory cells and the wordlines may include forming the plurality of insulating layers and a plurality of sacrificial layers alternatingly and repeatedly stacked, on the substrate. The bit pillar may be formed. The sacrificial layers may be removed to expose sidewalls of the bit pillar between the insulating layers. The memory cells may be formed on the sidewalls of the bit pillar. The wordlines may be formed on the memory cells.

In yet other embodiments, recess regions may be formed in the sidewalls of the bit pillar. The recess regions may be self-aligned between the insulating layers, and the second silicon layer may be formed in the recess region.

In yet other embodiments, the second silicon layer may be formed of a selective epitaxial growth layer.

In yet other embodiments, the metal silicide layer may be confined between the insulating layers.

In yet other embodiments, the formation of the bit pillar may include forming a metal pillar. The first silicon layer may be formed to surround the metal pillar.

Particulars of other embodiments are incorporated in the following detailed description and drawings.

According to further embodiments, a non-volatile memory device may include a first wordline on a substrate, an insulating layer on the first wordline, and a second wordline on the insulating layer so that the insulating layer is between the first and second wordlines. A bit pillar may extend adjacent the first wordline, the insulating layer, and the second wordline in a direction perpendicular with respect to a surface of the substrate, and the bit pillar may be electrically conductive. A first memory cell may include a first resistance changeable element electrically coupled between the first wordline and the bit pillar, and a second memory cell may include a second resistance changeable element electrically coupled between the second wordline and the bit pillar.

According to still further embodiments, an electronic system may include a microprocessor and a non-volatile memory device electrically coupled with the microprocessor. The non-volatile memory device may include a first wordline on a substrate, an insulating layer on the first wordline, and a second wordline on the insulating layer so that the insulating layer is between the first and second wordlines. A bit pillar may extend adjacent the first wordline, the insulating layer, and the second wordline in a direction perpendicular with respect to a surface of the substrate, and the bit pillar may be electrically conductive. A first memory cell may include a first resistance changeable element electrically coupled between the first wordline and the bit pillar, and a second memory cell may include a second resistance changeable element electrically coupled between the second wordline and the bit pillar.

According to yet further embodiments, a method of fabricating a non-volatile memory device may include forming first, second, and third spaced apart insulating layers on a substrate and extending in a direction parallel with respect to a surface of the substrate. A bit pillar may be formed extending adjacent the first, second, and third spaced apart insulating layers in a direction perpendicular with respect to the surface of the substrate, and first and second memory cells may be formed. The first memory cell may include a first resistance changeable element electrically coupled to the bit pillar between the first and second insulating layers, and the second memory cell may include a second resistance changeable element electrically coupled to the bit pillar between the second and third insulating layers. First and second wordlines may be formed with the first wordline between the first and second insulating layers and with the first memory cell electrically coupled between the first wordline and the bit pillar, and with the second wordline between the second and third insulating layers with the second memory cell electrically coupled between the second wordline and the bit pillar.

BRIEF DESCRIPTION OF THE DRAWINGS

The foregoing and other features and advantages of inventive concepts will be apparent from the more particular description of embodiments of inventive concepts, as illustrated in the accompanying drawings in which like reference characters refer to the same elements throughout the different views. The drawings are not necessarily to scale, emphasis instead being placed upon illustrating the principles of inventive concepts. In the drawings.

DETAILED DESCRIPTION

Figure 1:
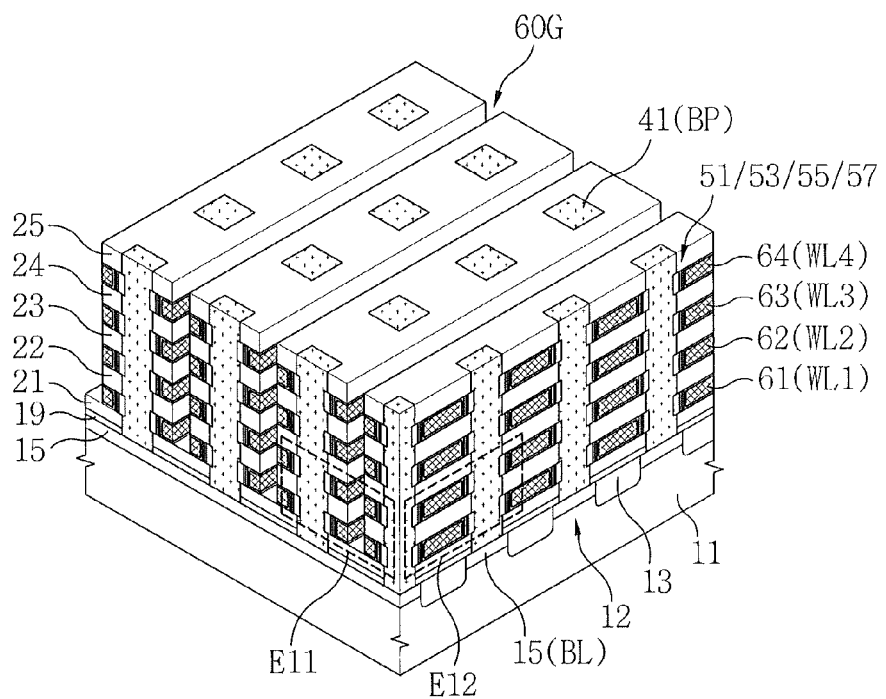
FIG. 1 is a perspective view illustrating a non-volatile memory device according to a first embodiments of inventive concepts.

Various embodiments will now be described more fully with reference to the accompanying drawings in which some embodiments are shown. Inventive concepts may, however, be embodied in different forms and should not be construed as limited to the embodiments set forth herein. Rather, these embodiments are provided so that this disclosure is thorough and complete and fully conveys inventive concepts to those skilled in the art. In the drawings, the sizes and relative sizes of layers and regions may be exaggerated for clarity.

It will be understood that when an element or layer is referred to as being "on," "connected to" or "coupled with" another element or layer, it can be directly on, connected or coupled with the other element or layer or intervening elements or layers may be present. In contrast, when an element is referred to as being "directly on," "directly connected to" or "directly coupled with" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, will be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of present inventive concepts.

Unless otherwise defined, all terms (including technical and scientific terms) used herein have the same meaning as commonly understood by one of ordinary skill in the art to which inventive concepts herein belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

[Embodiment 1]

Figure 2:
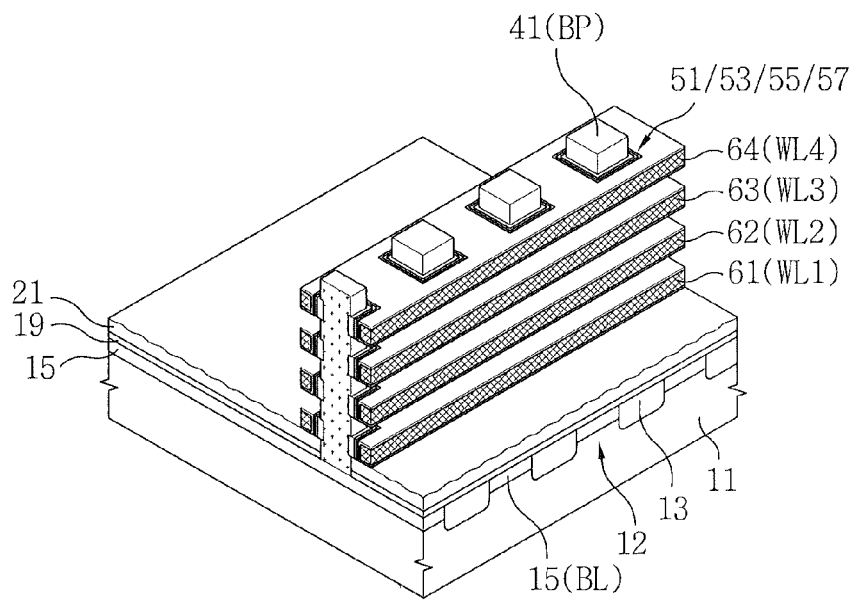
FIGS. 2, 5, 6 and 7 are partial perspective views illustrating portions of FIG. 1 in greater detail.
Figure 3:
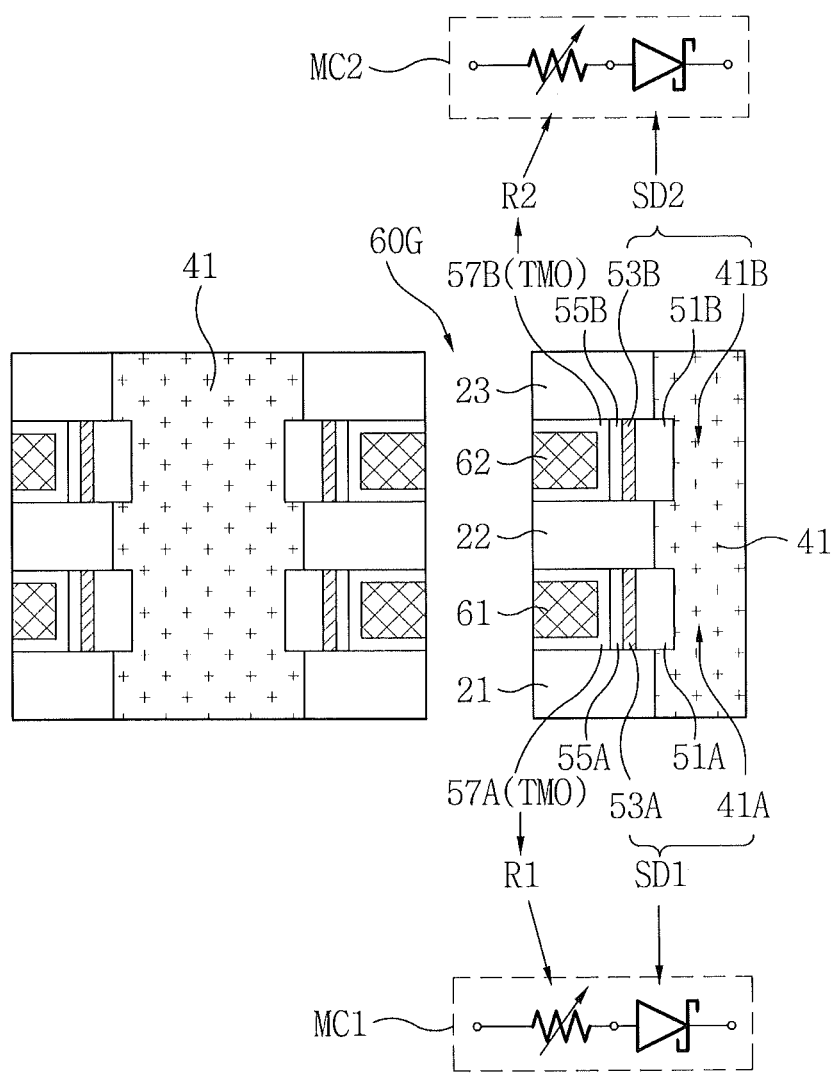
FIGS. 3 and 4 are partial cross-sectional views illustrating portions E11 and E12 of FIG. 1, respectively.
Figure 4:
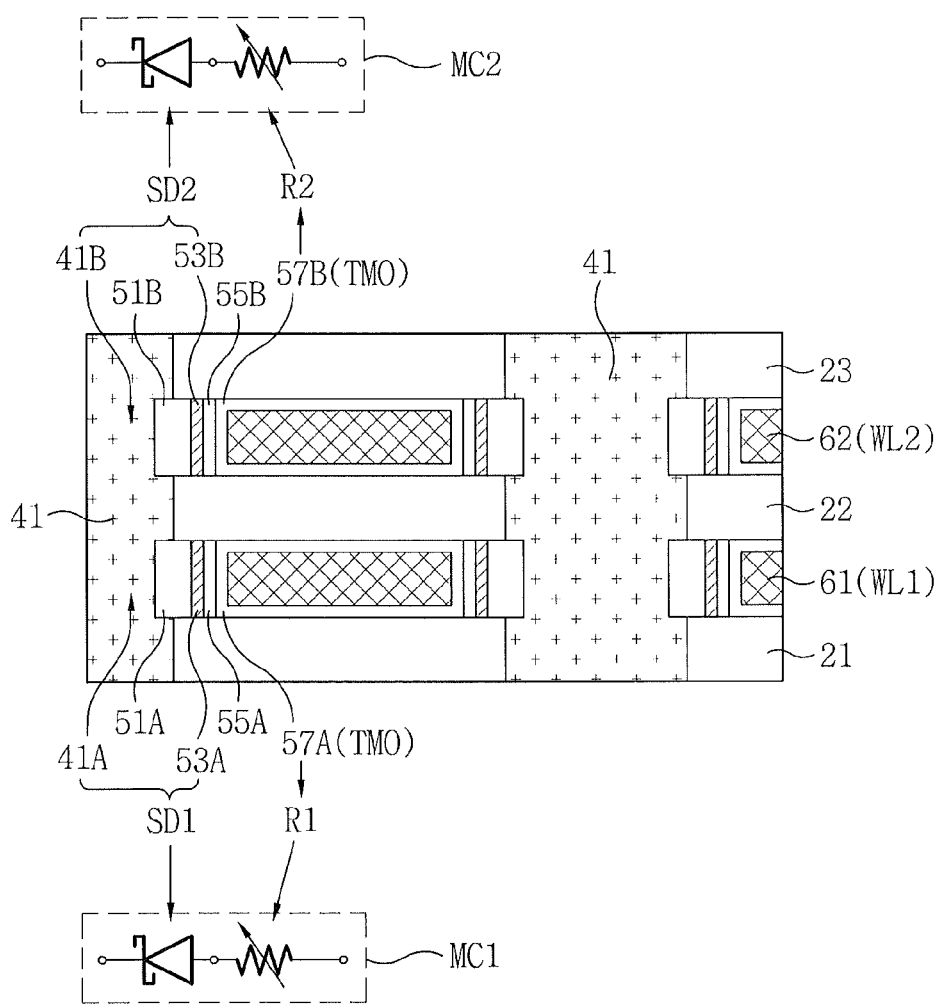
Figure 6:
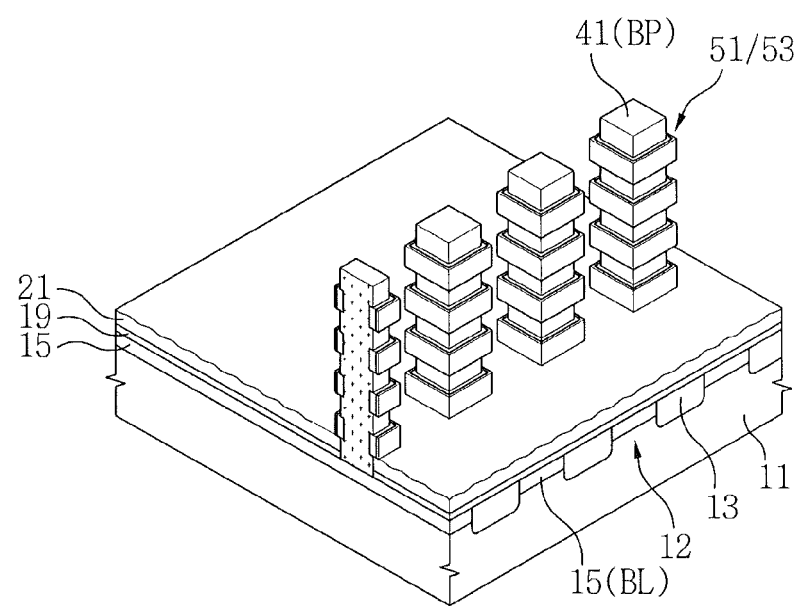
Figure 7:
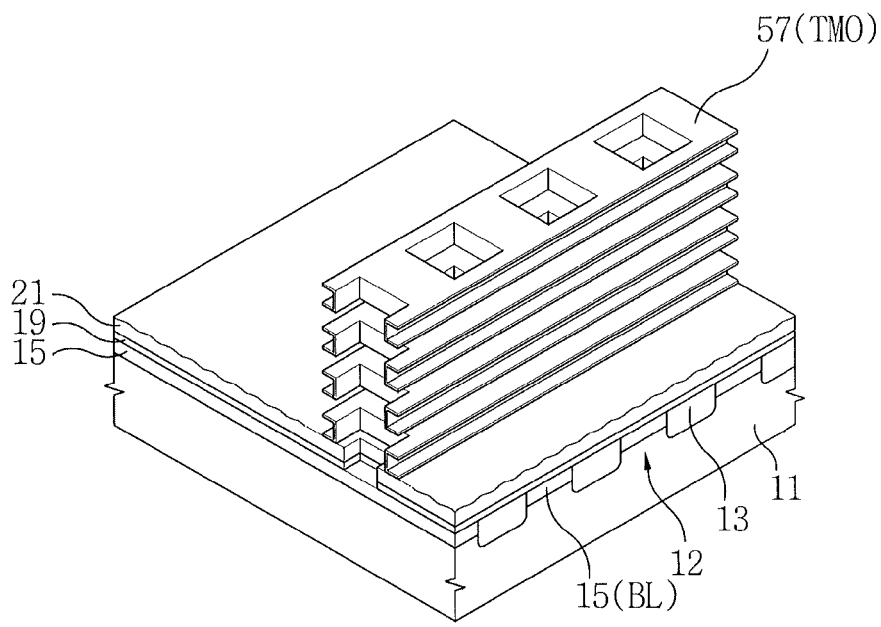
Figure 8:
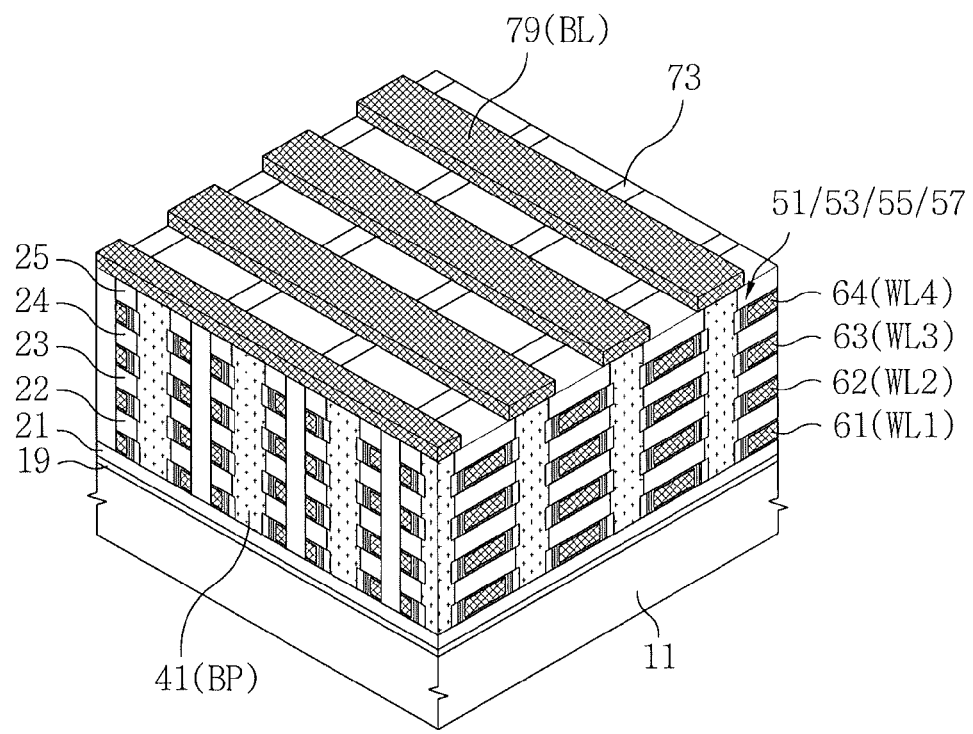
FIG. 8 is a perspective view illustrating a modified configuration of a non-volatile memory device according to the first embodiment of inventive concepts.

FIG. 1 is a perspective view illustrating a non-volatile memory device according to first embodiments of inventive concepts, FIGS. 2, 5, 6 and 7 are partial perspective views illustrating portions of FIG. 1 in detail, FIGS. 3 and 4 are partial cross-sectional views illustrating portions E11 and E12 of FIG. 1 respectively, and FIG. 8 is a perspective view illustrating a modified configuration of the non-volatile memory device according to the first embodiments of the inventive concepts.

Referring to FIG. 1, bit lines 15 and an isolation layer 13 may be provided on a semiconductor substrate 11. The bit lines 15 and the isolation layer 13 may be covered with a buffer oxide layer 19. Insulating layers 21 to 25 and wordlines 61 to 64 may be alternatingly and repeatedly stacked on the buffer oxide layer 19. Bit pillars 41 may be connected to the bit lines 15 through the insulating layers 21 to 25, the wordlines 61 to 64, and the buffer oxide layer 19. Memory cells may be disposed between the wordlines 61 to 64, and the bit pillars 41. Each memory cell may include an interfacial layer 51, a metal silicide layer 53, an electrode 55, and a resistance changeable element 57.

Each of the bit pillars 41 may include a semiconductor layer doped with impurities at a first concentration. For example, each bit pillar 41 may be an N-type polysilicon layer or a P-type polysilicon layer. In embodiments discussed with respect to FIG. 1, the bit pillars 41 will be described, as N-type polysilicon layers.

The interfacial layer 51 may include an intrinsic semiconductor layer and/or a semiconductor layer with impurities at a second concentration lower than the first concentration. For example, the interfacial layer 51 may include a selective epitaxial growth (SEG) layer, an Si layer, an SiGe layer, and/or an SiC layer.

The metal silicide layer 53 may include a TiSi layer, a ZrSi layer, a CoSi layer, a WSi layer, a NiSi layer, a PdSi layer, a PtSi layer, a HfSi layer, and/or a MoSi layer.

The electrode 55 may be a metal oxide layer having a metal element also contained in the metal silicide layer 53. For example, the electrode 55 may include a TiSiO layer, a TiO layer, a ZrO layer, a CoO layer, a WO layer, a NiO layer, a PdO layer, and/or a PtO layer. In some embodiments, the electrode 55 may include a CuO layer, an indium zinc oxide (IZO) layer, and/or an indium tin oxide (ITO) layer.

The resistance changeable element 57 may include a transition metal oxide (TMO) layer, a phase change material layer, a solid electrolyte layer and/or a polymer layer. For example, the resistance changeable element 57 may be a TiO layer, a TaO layer, a NiO layer, a ZrO layer, and/or a HfO layer.

The wordlines 61 to 64 may be low-temperature conductive layers formed at a lower temperature than a critical degradation temperature of the resistance changeable element 57. For example, each of the wordlines 61 to 64 may include a Ru layer and/or a W layer.

The resistance changeable element 57 may have high or low resistivity according to the application of an electrical signal. For example, when the resistance changeable element 57 is a TMO layer such as a TiO layer, a TaO layer, a NiO layer, a ZrO layer, and/or an HfO layer, the resistance changeable element 57 may have high resistivity in a reset state. After a write current flows in the resistance changeable element 57, the resistance changeable element 57 may provide a pathway for current flow, and thus may have low resistivity. When a read current lower than the write current flows in the resistance changeable element 57, the resistance changeable element 57 may maintain low resistivity. After a reset current higher than the write current flows in the resistance changeable element 57, the resistance changeable element 57 may have high resistivity.

Referring to FIG. 2, the bit lines 15 may be parallel to each other. The wordlines 61 to 64 may cross the bit lines 15. The wordlines 61 to 64 may be sequentially stacked in a direction perpendicular with respect to a surface of substrate 11. The bit pillars 41 may be connected to the bit lines 15 through the wordlines 61 to 64.

Referring to FIGS. 3 and 4, a first memory cell MC1 may be provided between a bit pillar 41 and a first wordline 61, and a second memory cell MC2 may be provided between the bit pillar 41 and a second wordline 62. The first memory cell MC1 may include a first resistance changeable element R1 57A and a first schottky diode SD1, and the second memory cell MC2 may include a second resistance changeable element R2 57B and a second schottky diode SD2.

The first schottky diode SD1 may be connected in series to the first resistance changeable element R1 57A. The first schottky diode SD1 may include a first part 41A of the selected one of the bit pillars 41, a first interfacial layer 51A on the first part 41A, and a first metal silicide layer 53A on the first interfacial layer 51A. A first electrode 55A may be disposed between the first resistance changeable element R1 57A and the first metal silicide layer 53A. The first wordline 61, the first resistance changeable element R1 57A, the first electrode 55A, the first metal silicide layer 53A, and the first interfacial layer 51A may be disposed between the first and second insulating layers 21 and 22.

The first schottky diode SD1 may be operated responsive to an applied potential difference between the selected one of the bit pillars 41 and the first wordline 61. The first schottky diode SD1 may serve as a switching device. The first interfacial layer 51A may serve to reduce a leakage current between the first metal silicide layer 53A and the first part 41A. In other words, because of the first interfacial layer 51A, the leakage current of the first schottky diode SD1 may be reduced as compared to conventional structures.

The second schottky diode SD2 may be connected in series to the second resistance changeable element R2 57B. The second schottky diode SD2 may include a second part 41B of one selected from the bit pillars 41, a second interfacial layer 51B on the second part 41B, and a second metal silicide layer 53B on the second interfacial layer 51B. A second electrode 55B may be disposed between the second resistance changeable element R2 57B and the second metal silicide layer 53B. The second wordline 62, the second resistance changeable element R2 57B, the second electrode 55B, the second metal silicide layer 53B, and the second interfacial layer 51B may be disposed between the second and third insulating layers 22 and 23.

The first interfacial layer 51A and the second interfacial layer 51B may have same thickness, the first metal silicide layer 53A and the second metal silicide layer 53B may have a same thickness, and the first electrode 55A and the second electrode 55B may have a same thickness. The first resistance changeable element R1 57A and the second resistance changeable element R2 57B may have a same thickness.

Accordingly, the first memory cell MC1 and the second memory cell MC2 may have substantially the same electrical characteristics. In other words, the plurality of memory cells MC1 and MC2 on the semiconductor substrate 11 may provide substantially uniform electrical characteristics.

Figure 5:
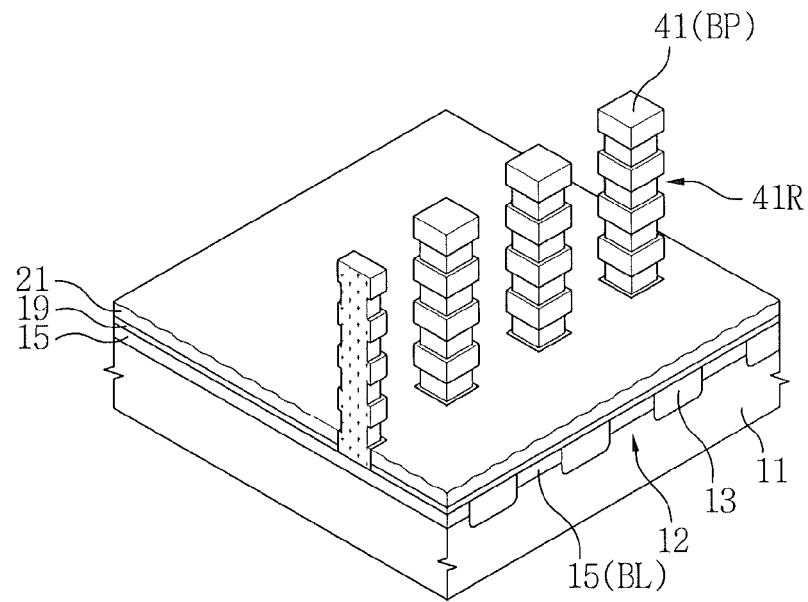

Referring to FIGS. 1 and 5, the bit pillars 41 may be perpendicular with respect to a surface of the semiconductor substrate 11. The bit pillars 41 may have recess regions 41R formed in sidewalls thereof. Referring to FIG. 1, the recess regions 41R may be self-aligned between the insulating layers 21 to 25.

Referring to FIGS. 1 and 6, the interfacial layers 51 may fill the recess regions 41R and extend between the insulating layers 21 to 25. The metal silicide layers 53 may be disposed on the interfacial layers 51. As shown in FIG. 1, the interfacial layers 51 and the metal silicide layers 53 may be confined between respective adjacent ones of insulating layers 21 to 25. The metal silicide layers 53 may be self-aligned with respective interfacial layers 51.

Referring to FIGS. 1 and 7, the resistance changeable elements 57 may be disposed between the wordlines 61 to 64 and the bit pillars 41. In addition, the resistance changeable elements 57 may extend to cover top and bottom surfaces of respective wordlines 61 to 64.

Referring to FIG. 8, the bit pillars 41 may be disposed perpendicular respect with to the surface of the semiconductor substrate 11 on the first insulating layer 21. A gap-fill insulating layer 73 may be provided between the wordlines 61 to 64. Bit lines 79 may be disposed on the fifth insulating layer 25 and the gap-fill insulating layer 73. The bit lines 79 may be connected to the bit pillars 41.

Embodiment 2

Figure 9:
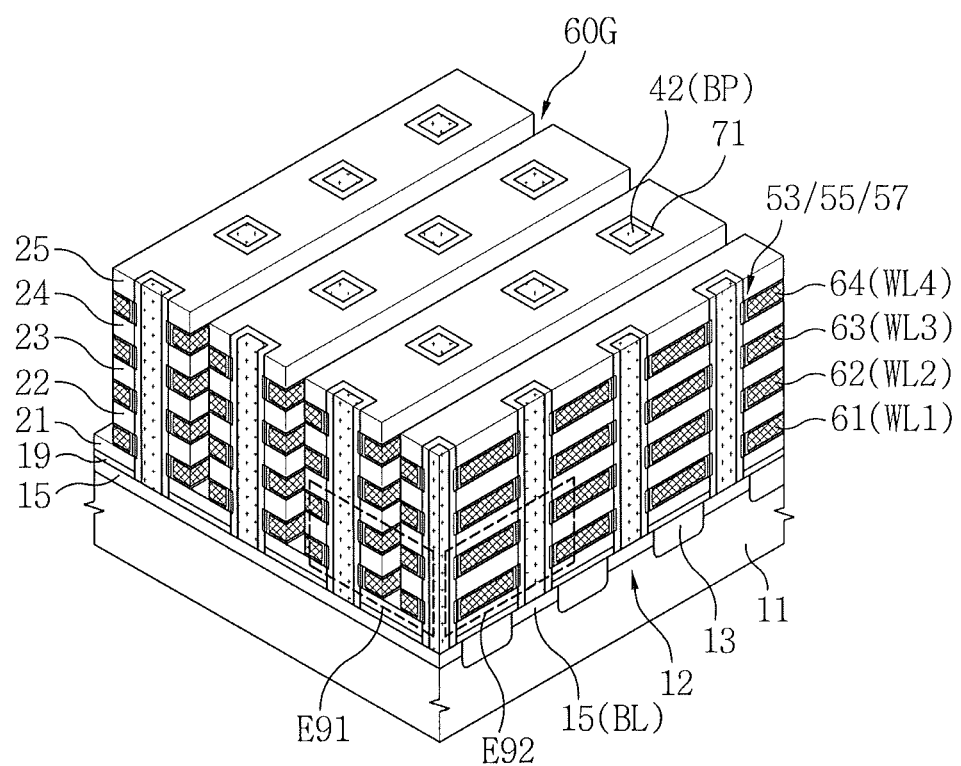
FIG. 9 is a perspective view illustrating a non-volatile memory device according to second embodiments of the inventive concepts.
Figure 10:
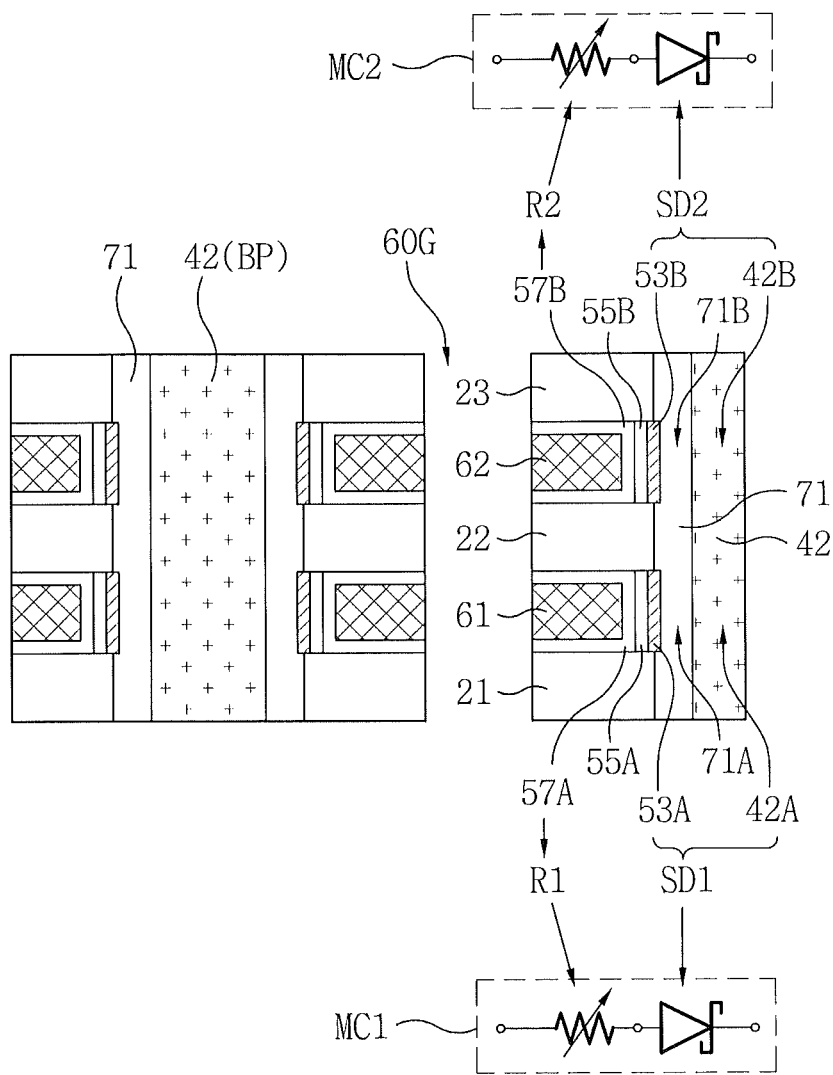
FIGS. 10 and 11 are partial cross-sectional views illustrating portions E91 and E92 of FIG. 9, respectively.
Figure 11:
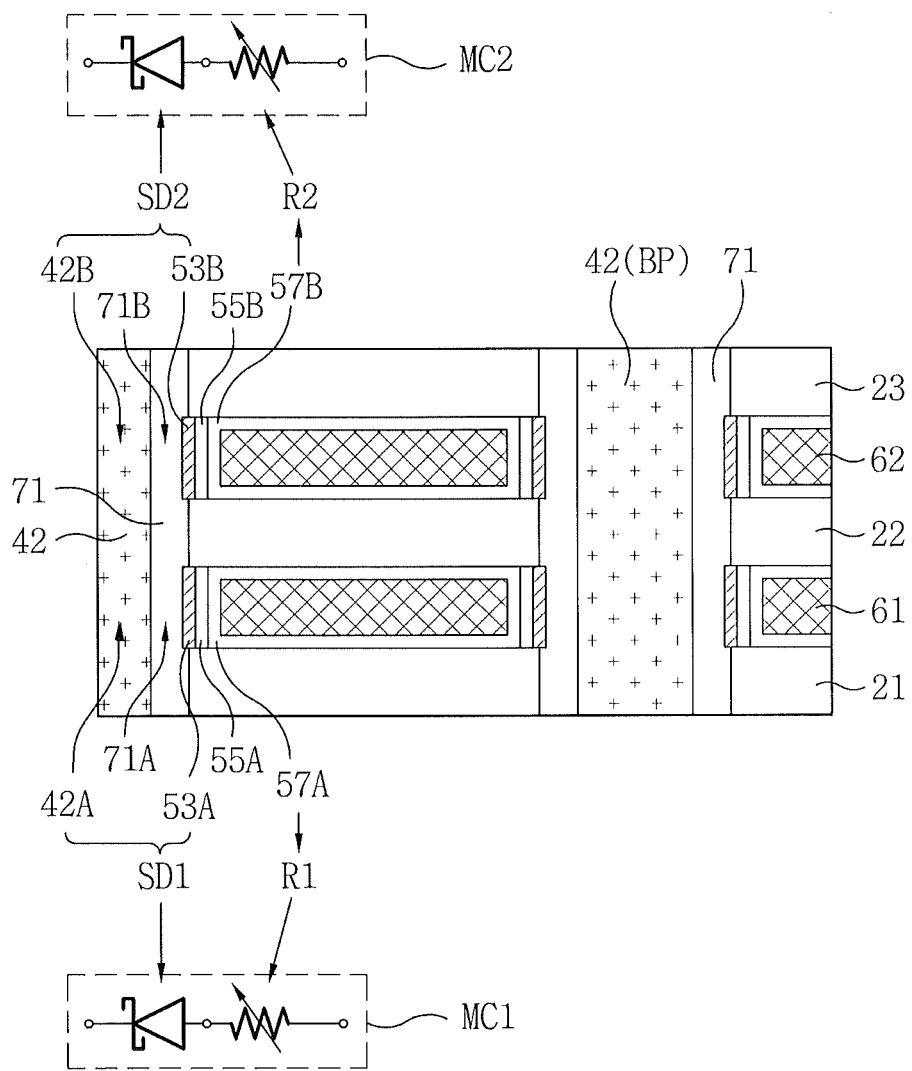

FIG. 9 is a perspective view illustrating a non-volatile memory device according to second embodiments of inventive concepts, and FIGS. 10 and 11 are partial cross-sectional views illustrating portions E91 and E92 of FIG. 9 respectively.

Referring to FIG. 9, interfacial layers 71 surrounding sidewalls of bit pillars 42 may be provided. The bit pillars 42 may include a semiconductor layer doped with impurities at a first concentration. For example, bit pillars 42 may be N-type polysilicon layers or P-type polysilicon layers. The interfacial layers 71 may be intrinsic semiconductor layers or semiconductor layers doping with impurities at a second concentration lower than the first concentration. For example, the interfacial layers 71 may be undoped polysilicon layers.

Referring to FIGS. 10 and 11, a first memory cell MC1 may be provided between the bit pillar 42 and a first wordline 61, and a second memory cell MC2 may be provided between the bit pillar 42 and a second wordline 62. The first memory cell MC1 may include a first resistance changeable element R1 57A and a first schottky diode SD1, and the second memory cell MC2 may include a second resistance changeable element R2 57B and a second schottky diode SD2.

The first schottky diode SD1 may include a first portion 42A of the bit pillar 42, a first interfacial layer portion 71A on the first portion 42A, and a first metal silicide layer 53A on the first interfacial layer portion 71A. A first electrode 55A may be disposed between the first resistance changeable element R1 57A and the first metal silicide layer 53A. The first wordline 61, the first resistance changeable element R1 57A, the first element 55A, and the first metal silicide layer 53A may be disposed between a first insulating layer 21 and a second insulating layer 22. The first metal silicide layer 53A may be confined between the first and second insulating layers 21 and 22.

The second schottky diode SD2 may include a second portion 42B of the bit pillar 42, a second interfacial layer portion 71B on the second portion 42B, and a second metal silicide layer 53B on the second interfacial layer portion 71B. A second electrode 55B may be disposed between the second resistance changeable element R2 57B and the second metal silicide layer 53B. The second wordline 62, the second resistance changeable element R2 57B, the second electrode 55B, and the second metal silicide layer 53B may be disposed between the second insulating layer 22 and a third insulating layer 23.

Embodiment 3

Figure 12:
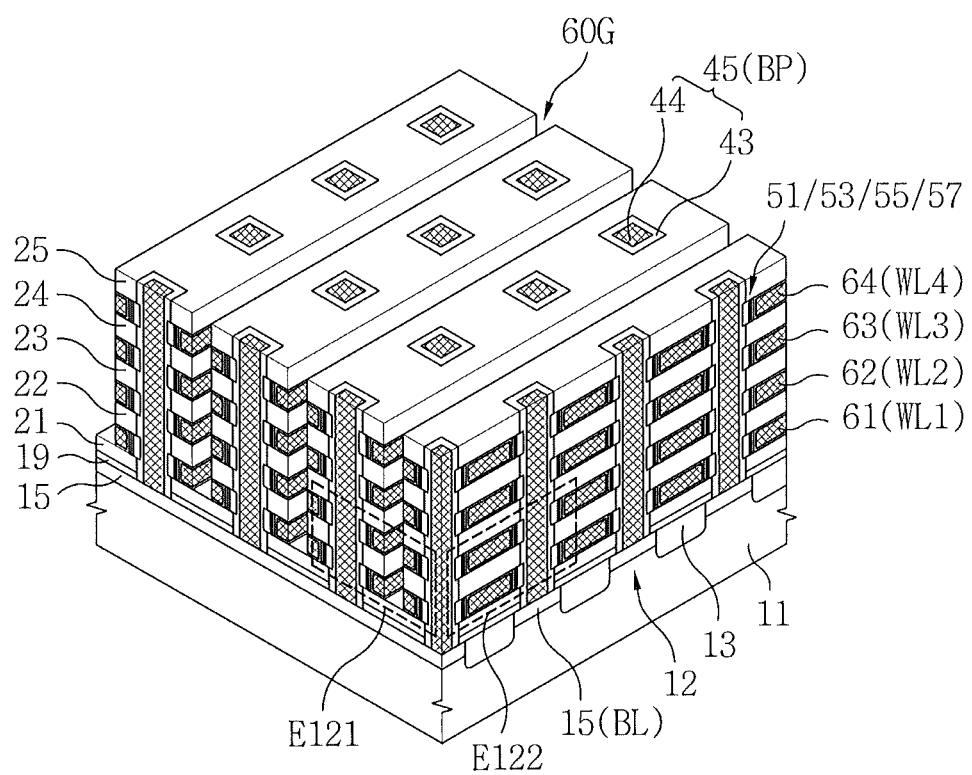
FIG. 12 is a perspective view illustrating a non-volatile memory device according to third embodiments of inventive concepts.
Figure 13:
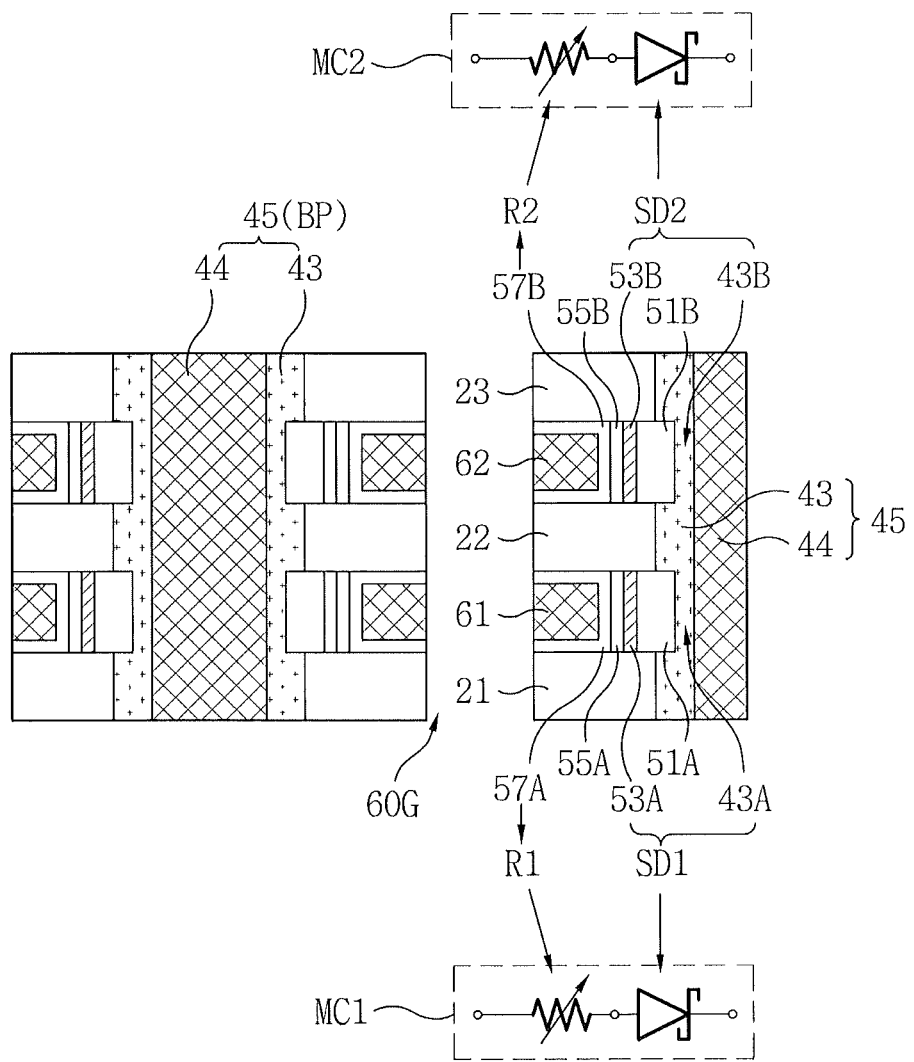
FIGS. 13 and 14 are partial cross-sectional views illustrating portions E121 and E122 of FIG. 12, respectively.
Figure 14:
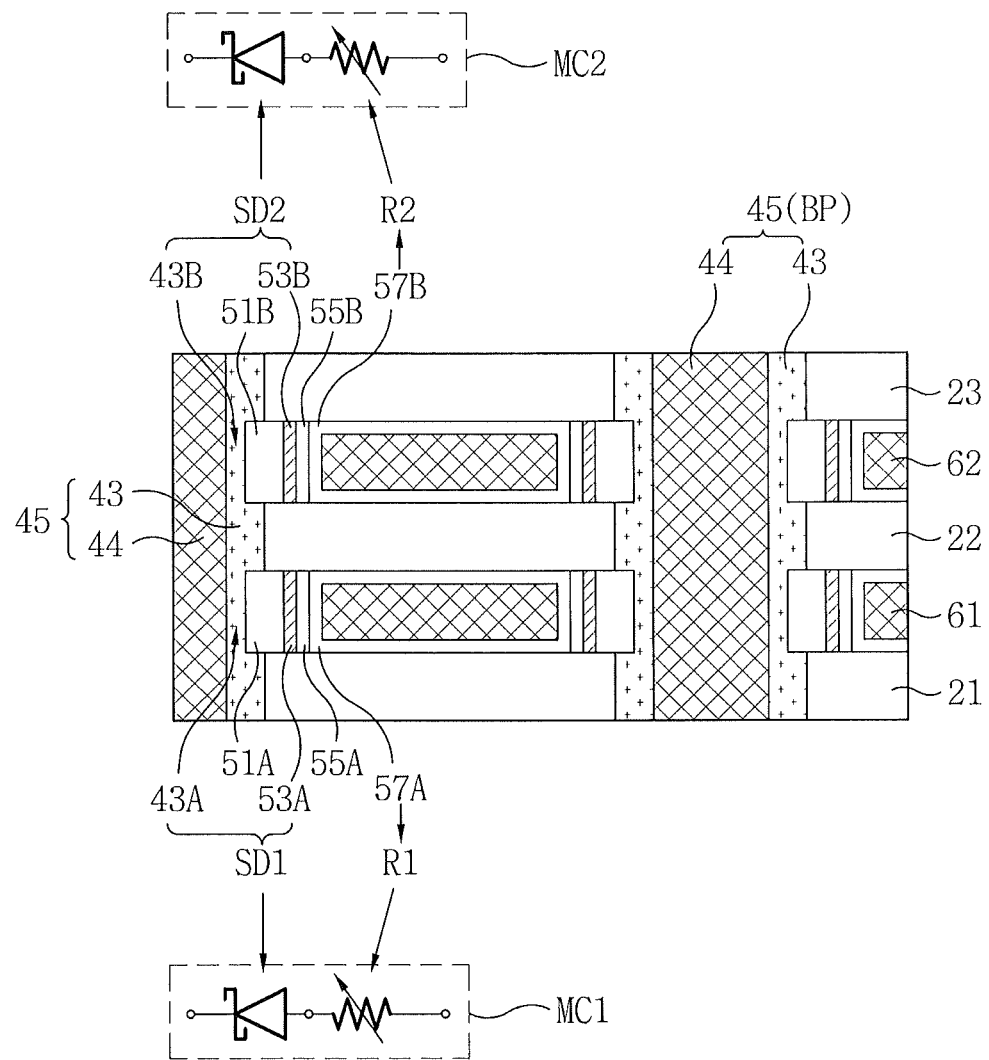

FIG. 12 is a perspective view illustrating a non-volatile memory device according to third embodiments of inventive concepts, and FIGS. 13 and 14 are partial cross-sectional views illustrating portions E121 and E122 of FIG. 12 respectively.

Referring to FIG. 12, each bit pillar 45 may include a metal pillar 44 and a bit semiconductor layer 43 surrounding the metal pillar 44. The metal pillar 44 may be a metal or metal compound/alloy layer having relatively high conductivity, such as a TiN layer. Each bit semiconductor layer 43 may include a semiconductor layer doped with impurities at a first concentration. For example, each bit semiconductor layer 43 may be an N-type polysilicon layer or a P-type polysilicon layer.

Referring to FIGS. 13 and 14, a first memory cell MC1 may be provided between a bit pillar 45 and a first wordline 61, and a second memory cell MC2 may be provided between the bit pillar 45 and a second wordline 62. The first memory cell MC1 may include a first resistance changeable element R1 57A and a first schottky diode SD1, and the second memory cell MC2 may include a second resistance changeable element R2 57B and a second schottky diode SD2.

The first schottky diode SD1 may include a first portion 43A of the bit semiconductor layer 43, a first interfacial layer 51A on the first portion 43A, and a first metal silicide layer 53A on the first interfacial layer 51A. A first electrode 55A may be disposed between the first resistance changeable element R1 57A and the first metal silicide layer 53A. The first wordline 61, the first resistance changeable element R1 57A, the first electrode 55A, the first metal silicide layer 53A, and the first interfacial layer 51A may be disposed between a first insulating layer 21 and a second insulating layer 22. The first metal silicide layer 53A and the first interfacial layer 51A may be confined between the first and second insulating layers 21 and 22.

The second schottky diode SD2 may include a second portion 43B of the bit semicondcutor layer 43, a second interfacial layer 51B on the second portion 43B, and a second metal silicide layer 53B on the second interfacial layer 51B. A second electrode 55B may be disposed between the second resistance changeable element R2 57B and the second metal silicide layer 53B. The second wordline 62, the second resistance changeable element R2 57B, the second electrode 55B, the second metal silicide layer 53B, and the second interfacial layer 51B may be disposed between the second insulating layer 22 and a third insulating layer 23.

Embodiment 4

Figure 15:
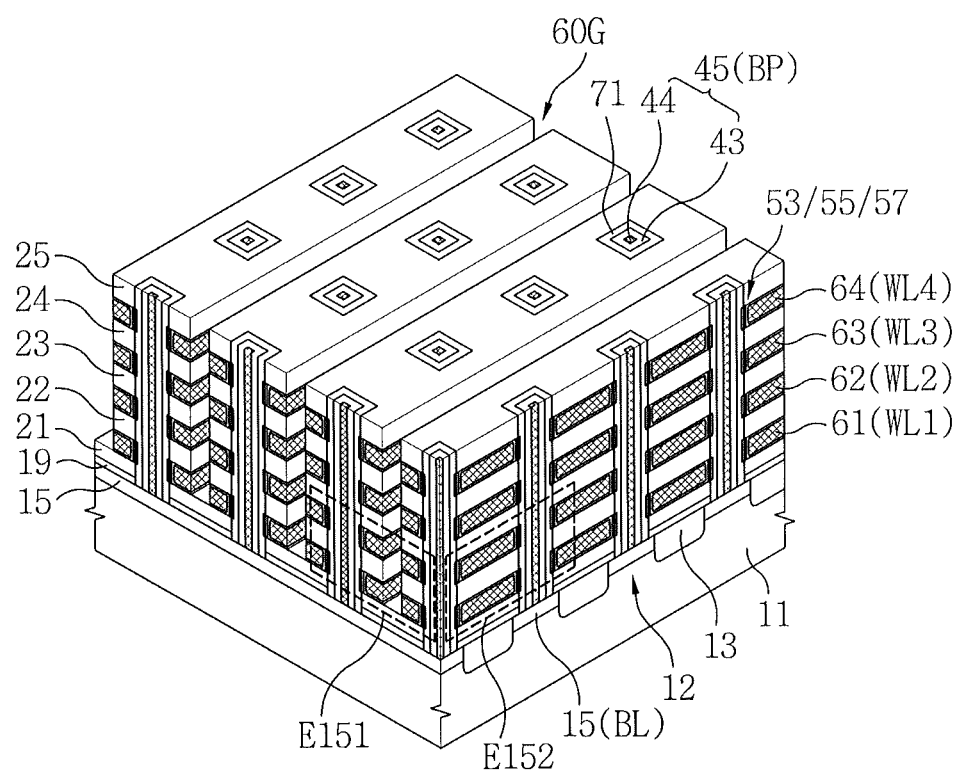
FIG. 15 is a perspective view illustrating a non-volatile memory device according to fourth embodiments of inventive concepts.
Figure 16:
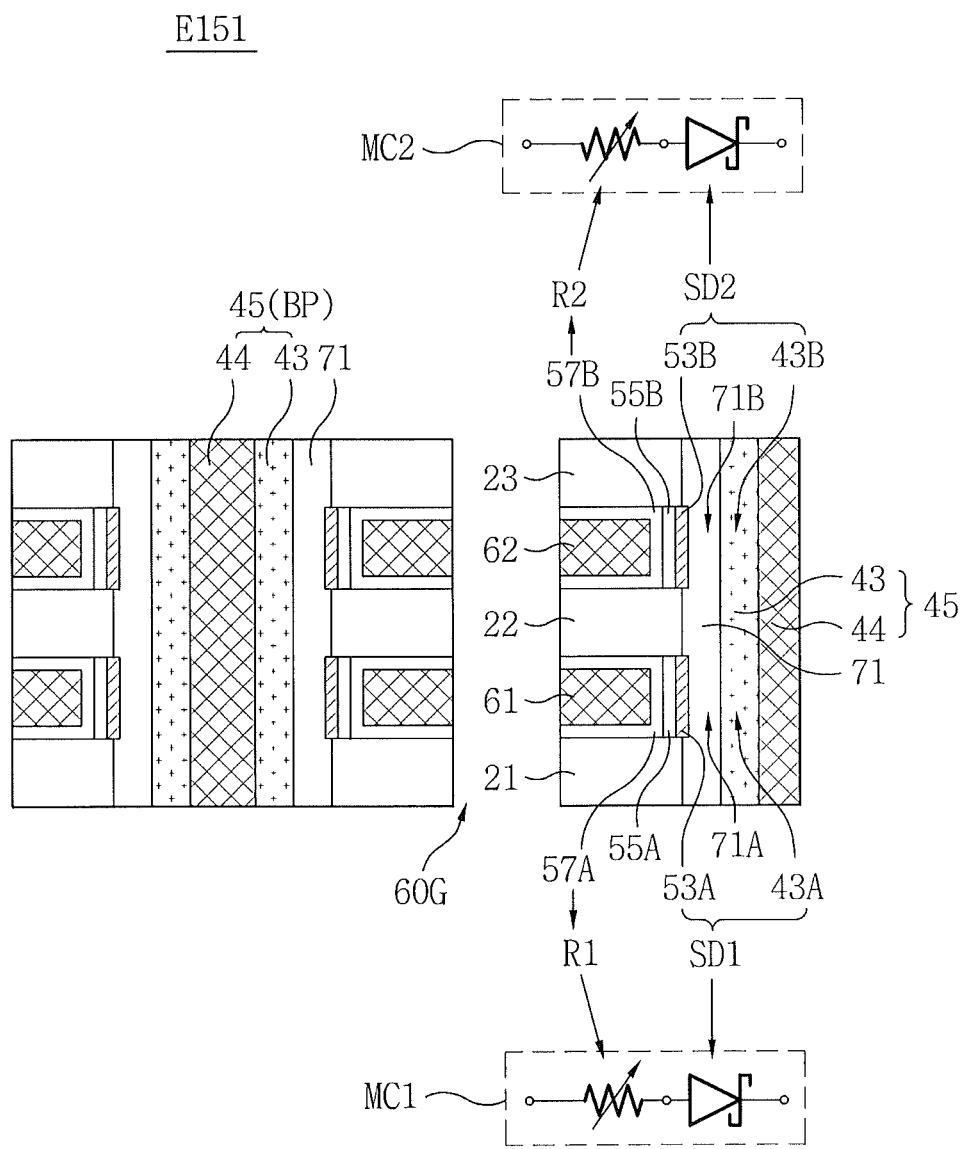
FIGS. 16 and 17 are partial cross-sectional views illustrating portions E151 and E152 of FIG. 15, respectively.
Figure 17:
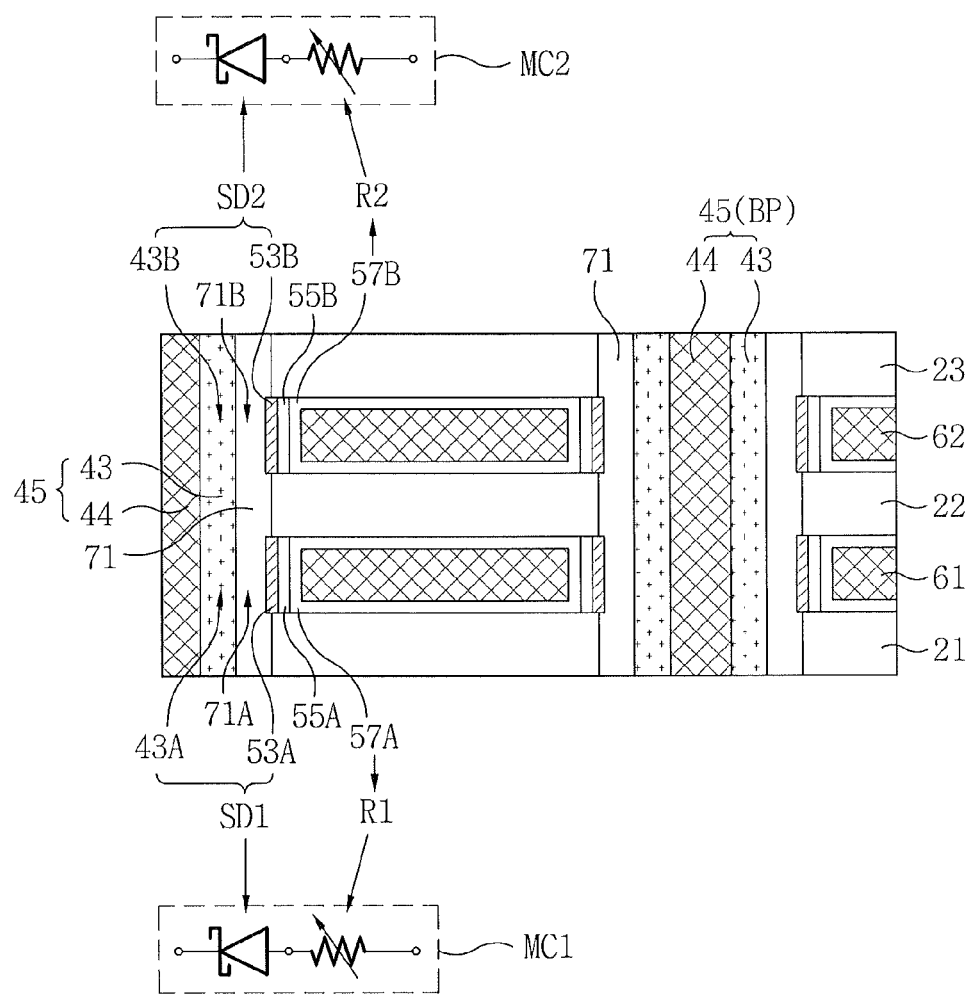

FIG. 15 is a perspective view illustrating a non-volatile memory device according to fourth embodiments of the inventive concepts, and FIGS. 16 and 17 are partial cross-sectional views illustrating portions E151 and E152 of FIG. 15 respectively.

Referring to FIG. 15, each bit pillar 45 may include a metal pillar 44 and a bit semiconductor layer 43 surrounding the metal pillar 44. Interfacial layer 71 surrounding sidewalls of the bit pillars 45 may also be provided. Each bit semiconductor layer 43 may be interposed between the respective metal pillar 44 and interfacial layer 71.

Each metal pillar 44 may be a metal layer having relatively high conductivity, such as a TiN layer. Each bit semiconductor layer 43 may include a semiconductor layer doped with impurities at a first concentration. For example, each bit semiconductor layer 43 may be an N-type polysilicon layer or a P-type polysilicon layer. Each interfacial layer 71 may be an intrinsic semiconductor layer or a semiconductor layer doped with impurities at a second concentration lower than the first concentration. For example, each interfacial layer 71 may be an undoped polysilicon layer. Each metal pillar 44 may include a metal silicide layer. Further, a separate metal silicide may be included between each metal pillar 44 and bit semiconductor layer 43, though being omitted herein to reduce complexity of the drawing.

Referring to FIGS. 16 and 17, a first memory cell MC1 may be provided between a bit pillar 45 and a first wordline 61, and a second memory cell MC2 may be provided between the bit pillar 45 and a second wordline 62. The first memory cell MC1 may include a first resistance changeable element R1 57A and a first schottky diode SD1, and the second memory cell MC2 may include a second resistance changeable element R2 57B and a second schottky diode SD2.

The first schottky diode SD1 may include a first portion 43A of the bit semiconductor layer 43, a first interfacial layer portion 71A on the first portion 43A, and a first metal silicide layer 53A on the first interfacial layer portion 71A. A first electrode 55A may be disposed between the first resistance changeable element R1 57A and the first metal silicide layer 53A. The first wordline 61, the first resistance changeable element R1 57A, the first electrode 55A, and the first metal silicide layer 53A may be disposed between first and second insulating layers 21 and 22. The first metal silicide layer 53A may be confined between the first and second insulating layers 21 and 22.

The second schottky diode SD2 may include a second portion 43B of the bit semiconductor layer 43, a second interfacial layer portion 71B on the second portion 43B, and a metal silicide layer 53B on the second interfacial layer portion 71B. A second electrode 55B may be disposed between the second resistance changeable element R2 57B and the second metal silicide layer 53B. The second wordline 62, the second resistance changeable element R2 57B, the second element 55B, and the second metal silicide layer 53B may be disposed between the second insulating layer 22 and a third insulating layer 23.

Embodiment 5

Figure 18:
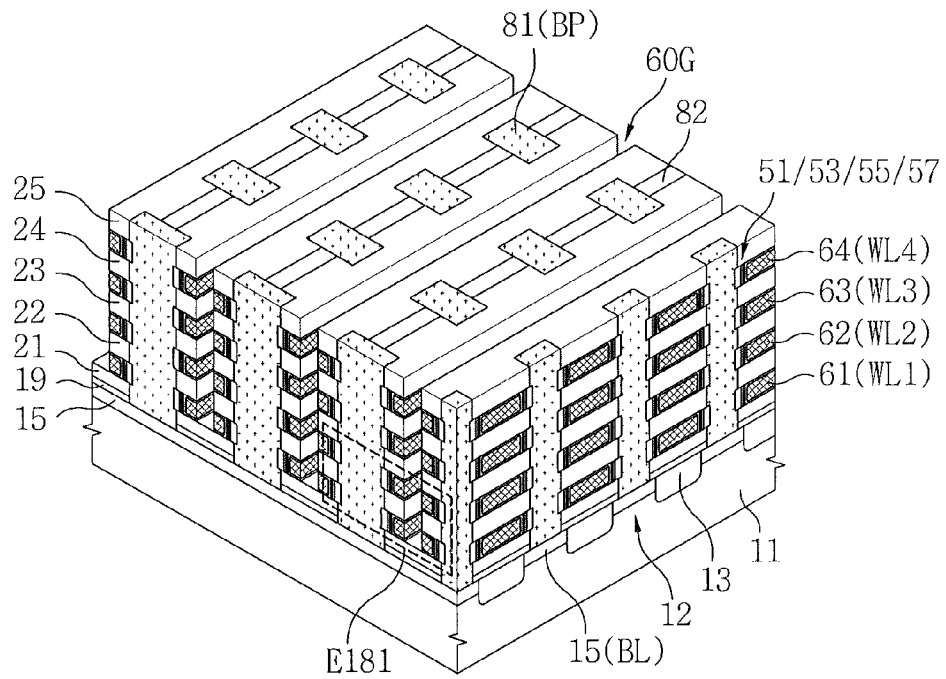
FIG. 18 is a perspective view illustrating a non-volatile memory device according to fifth embodiments of inventive concepts.
Figure 19:
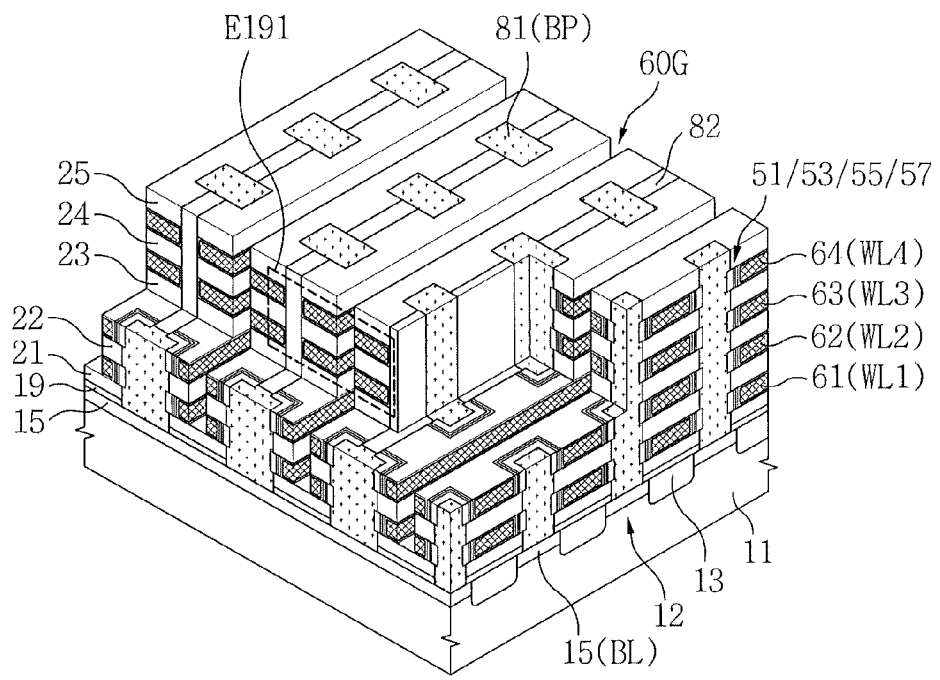
FIGS. 19, 20 and 23 are partial perspective views of FIG. 18 in greater detail.
Figure 20:
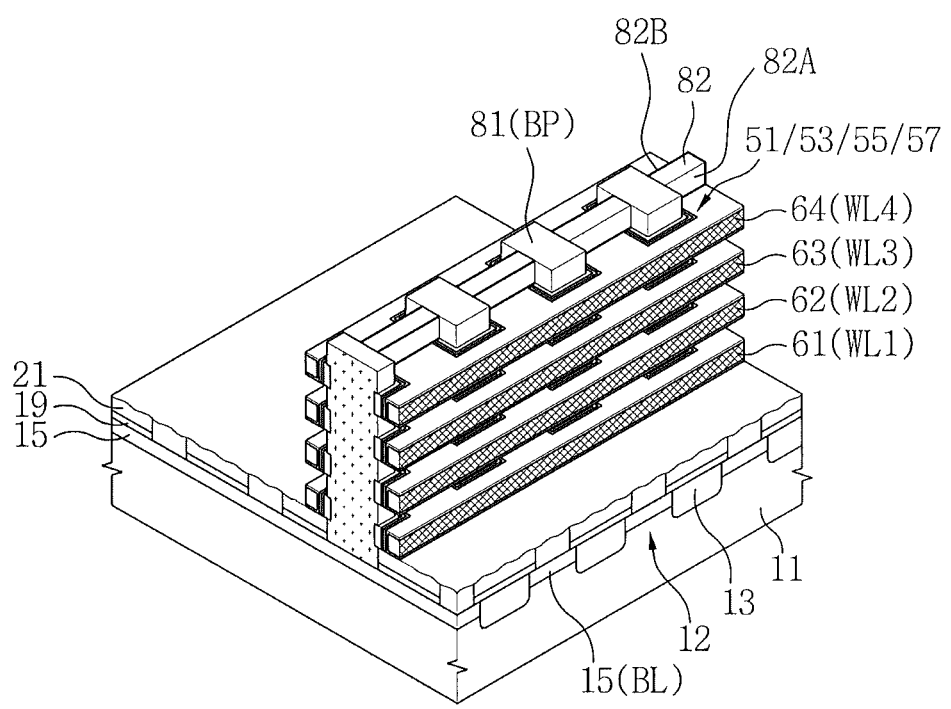
Figure 21:
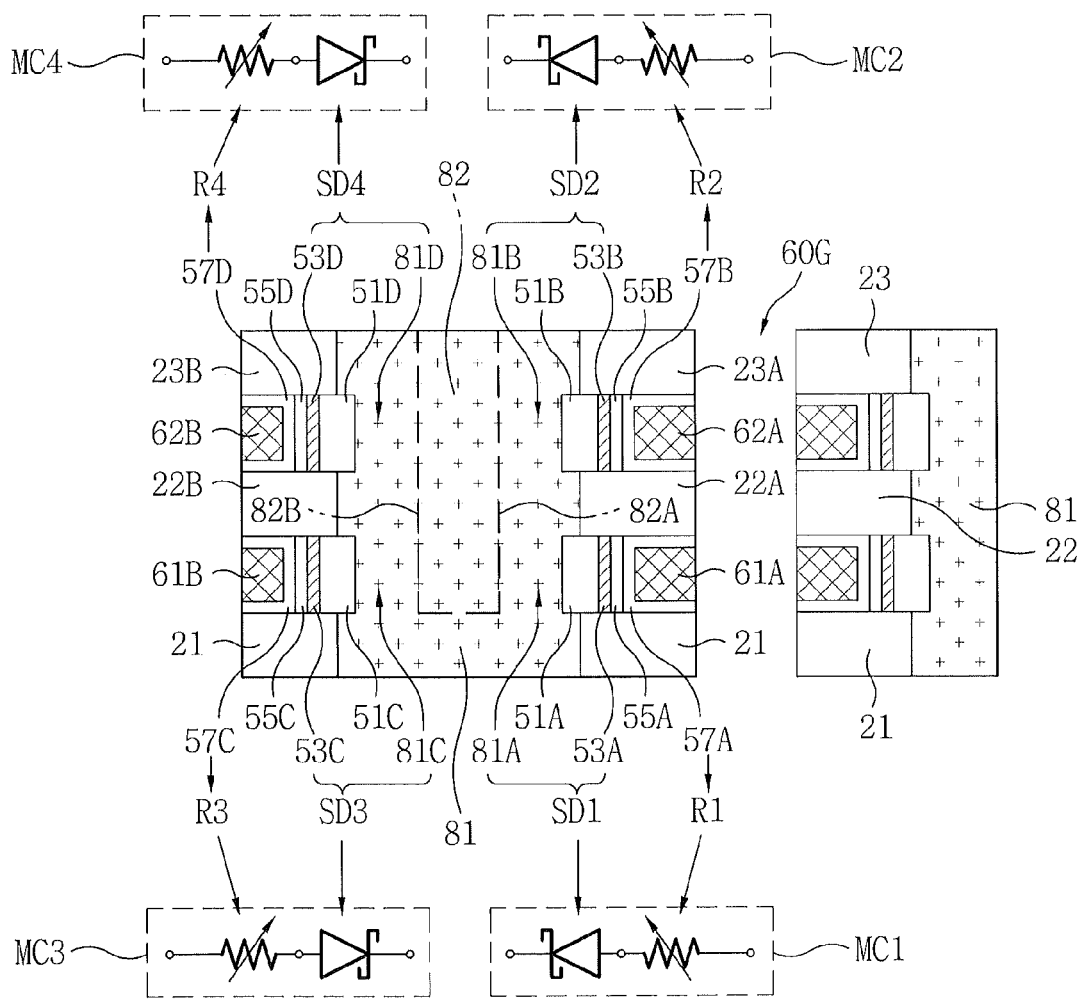
FIGS. 21 and 22 are partial cross-sectional views illustrating portion E181 of FIG. 18 and portion E191 part of FIG. 19, respectively.
Figure 22:
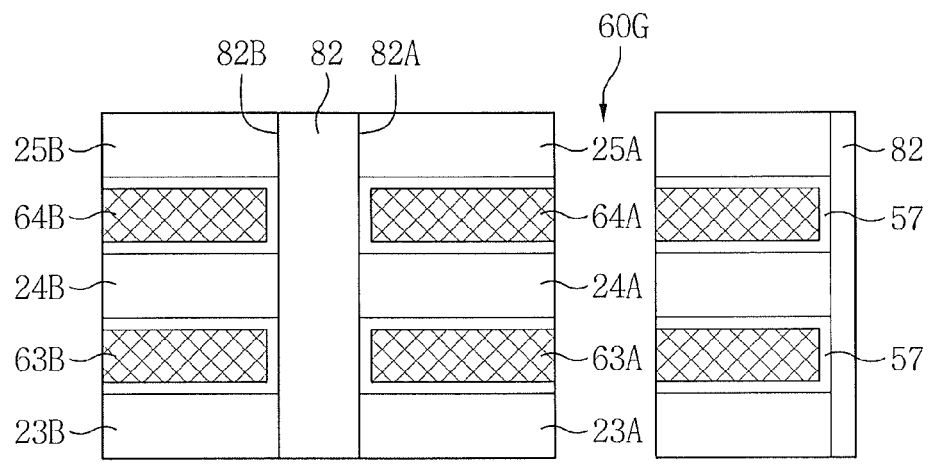
Figure 23:
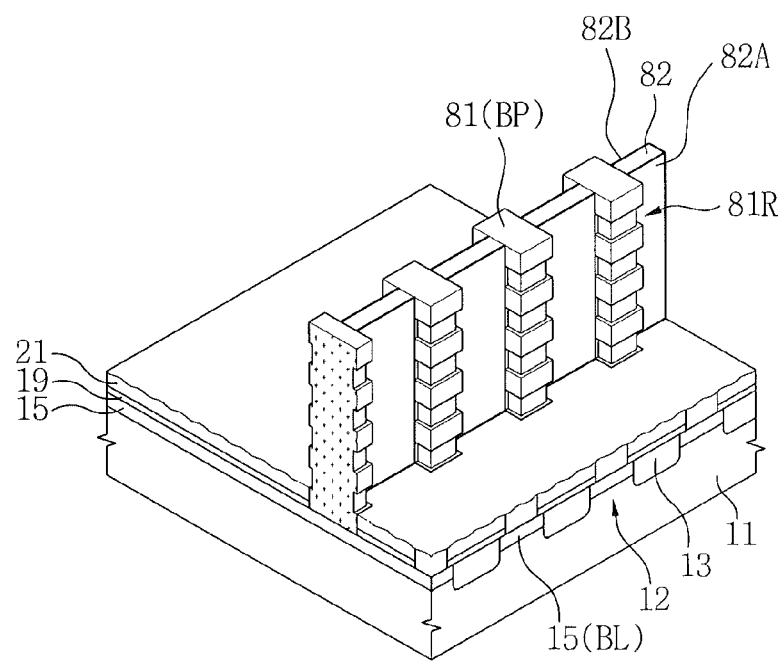

FIG. 18 is a perspective view illustrating a non-volatile memory device according to fifth embodiments of inventive concepts, FIGS. 19, 20, and 23 are partial perspective views of FIG. 18, and FIGS. 21 and 22 are partial cross-sectional views illustrating portion E181 part of FIG. 18 and portion E191 of FIG. 19.

Referring to FIGS. 18 and 19, bit lines 15 and an isolation layer 13 may be provided on a semiconductor substrate 11. The bit lines 15 and the isolation layer 13 may be covered with a buffer oxide layer 19. The buffer oxide layer 19 may be covered with a first insulating layer 21. Insulating barriers 82 may be provided on the first insulating layer 21. Wordlines 61 to 64 and second to fifth insulating layers 22 to 25 may be alternatingly and repeatedly stacked on the first insulating layer 21. The second to fifth insulating layers 22 to 25 may be in contact with sidewalls of the insulating barriers 82. The wordlines 61 to 64 may be adjacent to the sidewalls of the insulating barriers 82.

Bit pillars 81 may be connected to the bit lines 15 through the insulating barrier 82 and the first insulating layer 21. The bit pillars 81 may cross respective insulating barriers 82. alternatingly, bit pillars 81 may pass vertically through or cut insulating barriers 82. In other words, the bit pillars 81 may divide insulating barriers 82. The bit pillars 81 may be in contact with sidewalls of the first to fifth insulating layers 21 to 25, and may face the sidewalls of the wordlines 61 to 64.

Memory cells may be disposed between the wordlines 61 to 64 and the bit pillars 81. Each memory cell may include an interfacial layer 51, a metal silicide layer 53, an electrode 55, and a resistance changeable element 57.

Referring to FIGS. 18 and 20, the insulating barrier 82 may include a first sidewall 82A and a second sidewall 82B. The second to fifth insulating layers 22 to 25 may be in contact with the first and second sidewalls 82A and 82B. The bit pillars 81 may cross and/or pass through the insulating barrier 82. The wordlines 61 and 64 may face the bit pillars 81.

Referring to FIGS. 18, 20 and 21, for the convenience in description, among the wordlines 61 to 64, a first wordline 61A, a second wordline 62A, a third wordline 61B, and a fourth wordline 62B will be defined, and among the insulating layers 21 to 25, a first insulating layer 21, a second insulating layer 22A, a third insulating layer 23A, a fourth insulating layer 22B, and a fifth insulating layer 23B may be defined. The first wordline 61A adjacent to the first sidewall 82A may be disposed on the first insulating layer 21. The second insulating layer 22A in contact with the first sidewall 82A may be disposed on the first wordline 61A. The second wordline 62A adjacent to the first sidewall 82A may be disposed on the second insulating layer 22A. The third insulating layer 23A in contact with the first sidewall 82A may be disposed on the second wordline 62A. The third wordline 61B adjacent to the second sidewall 82B may be disposed on the first insulating layer 21. The fourth insulating layer 22B in contact with the second sidewall 82B may be disposed on the third wordline 61B. The fourth wordline 62B adjacent to the second sidewall 82B may be disposed on the fourth insulating layer 22B. The fifth insulating layer 23B in contact with the second sidewall 82B may be disposed on the fourth wordline 62B.

A first memory cell MC1 may be provided between the bit pillar 81 and the first wordline 61A, a second memory cell MC2 may be provided between the bit pillar 81 and the second wordline 62A, a third memory cell MC3 may be provided between the bit pillar 81 and the third wordline 61B, and a fourth memory cell MC4 may be provided between the bit pillar 81 and the fourth wordline 62B. The first memory cell MC1 may include a first resistance changeable element R1 57A and a first schottky diode SD1, the second memory cell MC2 may include a second resistance changeable element R2 57B and a second schottky diode SD2, the third memory cell MC3 may include a third resistance changeable element R3 57C and a third schottky diode SD3, and the fourth memory cell MC4 may include a fourth resistance changeable element R4 57D and a fourth schottky diode SD4.

The first schottky diode SD1 may include a first portion 81A of the bit pillar 81, a first interfacial layer 51A on the first portion 81A, and a first metal silicide layer 53A on the first interfacial layer 51A. A first electrode 55A may be disposed between the first resistance changeable element R1 57A and the first metal silicide layer 53A. The first wordline 61A, the first resistance changeable element R1 57A, the first electrode 55A, the first metal silicide layer 53A, and the first interfacial layer 51A may be disposed between the first and second insulating layers 21 and 22A. The second schottky diode SD2 may include a second portion 81B of the bit pillar 81, a second interfacial layer 51B on the second portion 81B, and a second metal silicide layer 53B on the second interfacial layer 51B. A second electrode 55B may be disposed between the second resistance changeable element R2 57B and the second metal silicide layer 53B. The second wordline 62A, the second resistance changeable element R2 57B, the second electrode 55B, the second metal silicide layer 53B, and the second interfacial layer 51B may be disposed between the second and third insulating layers 22A and 23A.

The third schottky diode SD3 may include a third portion 81C of the bit pillar 81, a third interfacial layer 51C on the third portion 81C, and a third metal silicide layer 53C on the third interfacial layer 51C. A third electrode 55C may be disposed between the third resistance changeable element R3 57C and the third metal silicide layer 53C. The third wordline 61B, the third resistance changeable element R3 57C, the third electrode 55C, the third metal silicide layer 53C, and the third interfacial layer 51C may be disposed between the first and fourth insulating layers 21 and 22B. The fourth schottky diode SD4 may include a fourth portion 81D of the bit pillar 81, a fourth interfacial layer 51D on the fourth portion 81D, and a fourth metal silicide layer 53D on the fourth interfacial layer 51D. A fourth electrode 55D may be disposed between the fourth resistance changeable element R4 57D and the fourth metal silicide layer 53D. The fourth wordline 62B, the fourth resistance changeable element R4 57D, the fourth electrode 55D, the fourth metal silicide layer 53D, and the fourth interfacial layer 51D may be disposed between the fourth and fifth insulating layers 22B and 23B.

Referring to FIGS. 19 and 22, for the convenience in description, among the wordlines 61 to 64, a fifth wordline 63A, a sixth wordline 64A, a seventh wordline 63B, and an eighth wordline 64B will be defined, and among the insulating layers 21 to 25, the third insulating layer 23A, the fifth insulating layer 23B, a sixth insulating layer 24A, a seventh insulating layer 25A, an eighth insulating layer 24B, and a ninth insulating layer 25B will be defined. The third insulating layer 23A, the sixth insulating layer 24A, and the seventh insulating layer 25A may be in contact with the first sidewall 82A, and the fifth wordline 63A and the sixth wordline 64A may be adjacent to the first sidewall 82A. The fifth insulating layer 23B, the eighth insulating layer 24B, and the ninth insulating layer 25B may be in contact with the second sidewall 82B, and the seventh wordline 63B and the eighth wordline 64B may be adjacent to the second sidewall 82B.

Referring to FIGS. 18 and 23, the insulating barrier 82 may be provided on the first insulating layer 21. The bit pillars 81 may be connected to the bit lines 15 through the first insulating layer 21 and the insulating barrier 82. The bit pillars 81 may have a greater width than the insulating barrier 82. The bit pillars 81 may project beyond sidewalls of the insulating barriers 82. The bit pillars 81 may include recess regions 81R. The recess regions 81R may be self-aligned between the insulating layers 21 to 25.

Embodiment 6

Figure 24:
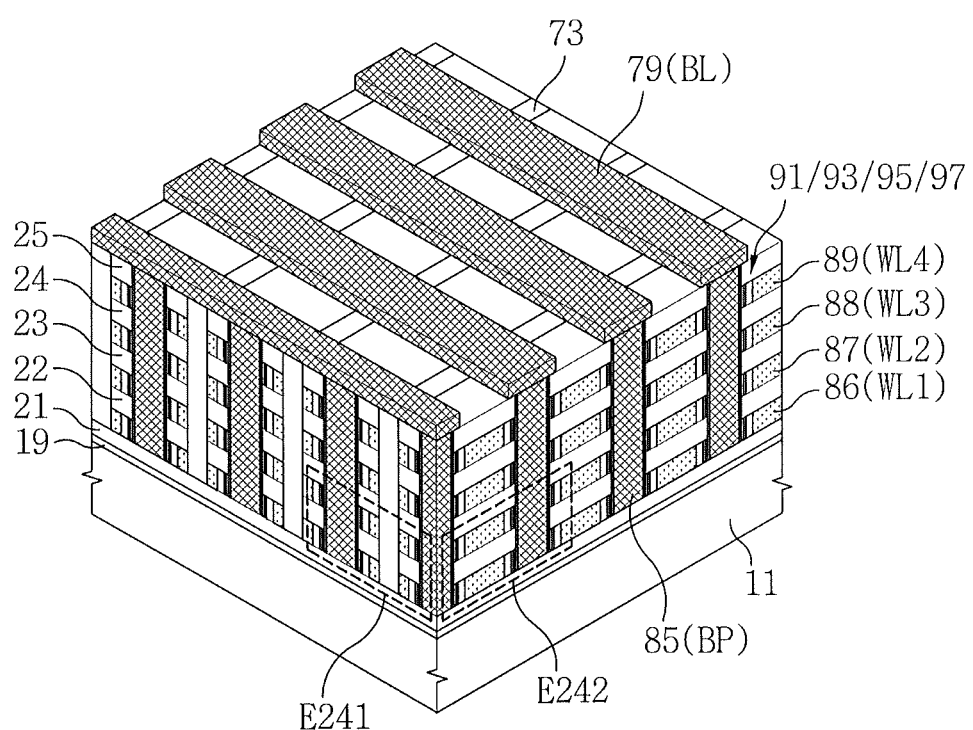
FIG. 24 is a perspective view illustrating a non-volatile memory device according to sixth embodiments of inventive concepts.
Figure 25:
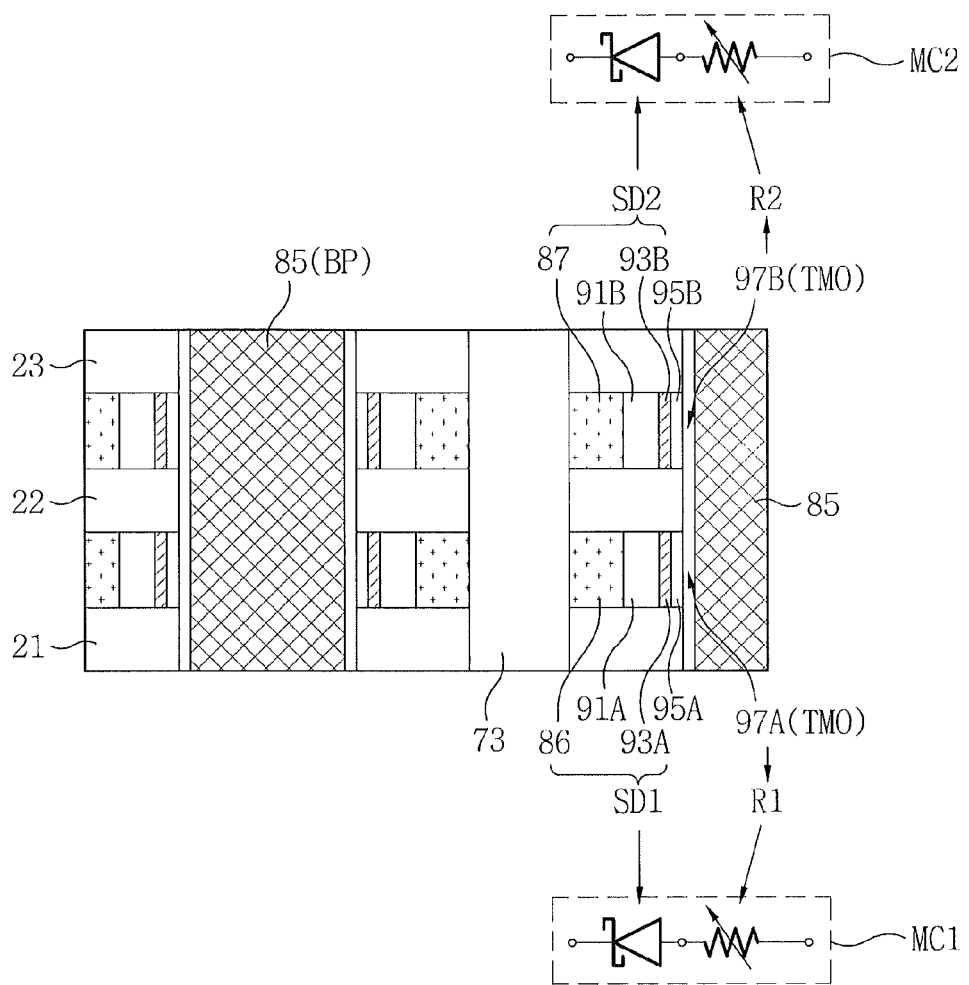
FIGS. 25 and 26 are partial cross-sectional views illustrating portions E241 and E242 of FIG. 24, respectively.
Figure 26:
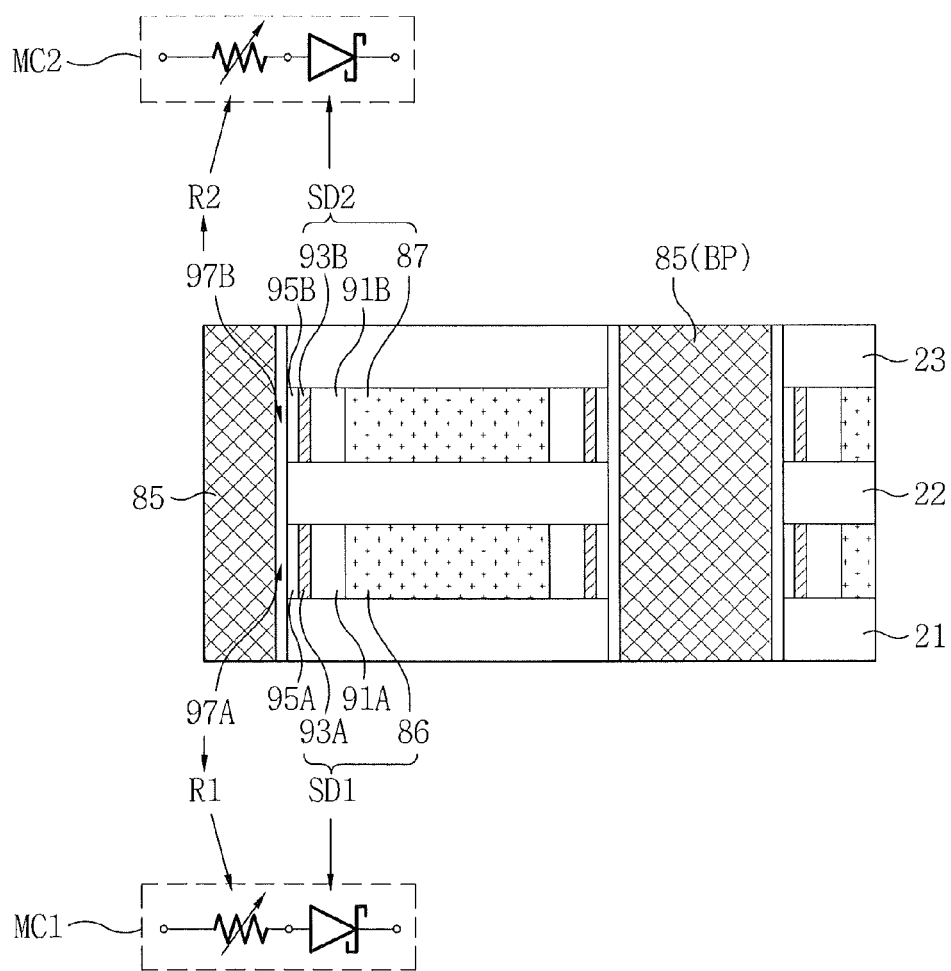

FIG. 24 is a perspective view illustrating a non-volatile memory device according to sixth embodiments of inventive concepts, and FIGS. 25 and 26 are partial cross-sectional views illustrating portions E241 and E242 of FIG. 24 respectively.

Referring to FIG. 24, a buffer oxide layer 19 may be stacked on a semiconductor substrate 11. Insulating layers 21 to 25 and wordlines 86 to 89 may be alternatingly and repeatedly stacked on the buffer oxide layer 19. Bit pillars 85 may be disposed perpendicular with respect to a surface of the semiconductor substrate 11 on the first insulating layer 21. A gap fill insulating layer 73 may be provided between the wordlines 86 to 89. Bit lines 79 may be disposed on the fifth insulating layer 25 and the gap fill insulating layer 73. The bit lines 79 may be connected to the bit pillars 85. Memory cells may be disposed between the wordlines 86 to 89 and the bit pillars 85. Each memory cell may include an interfacial layer 91, a metal silicide layer 93, an electrode 95, and a resistance changeable element 97. The resistance changeable element 97 may surround sidewalls of the bit pillars 85.

Each wordline 86 to 89 may include a semiconductor layer doped with impurities at a first concentration. For example, each wordlines 86 to 89 may be an N-type polysilicon layer or a P-type polysilicon layer. In embodiments discussed with respect to FIG. 24, the wordlines 86 to 89 will be described as N-type polysilicon layers. Each interfacial layer 91 may be an intrinsic semiconductor layer or a semiconductor layer doped with impurities at a second concentration lower than the first concentration. For example, each interfacial layer 91 may include a selective epitaxial growth (SEG) layer, an Si layer, an SiGe layer, and/or an SiC layer. Each resistance changeable element 97 may include a TMO layer, a phase change material layer, a solid electrolyte layer, and/or a polymer layer. For example, each resistance changeable element 97 may be a TiO layer, a TaO layer, a NiO layer, a ZrO layer, and/or an HfO layer. The bit pillars 85 may be low-temperature conductive layers formed at a lower temperature than a critical degradation temperature of the resistance changeable element 97. For example, the bit pillars 85 may include a Ru layer or a W layer.

Referring to FIGS. 25 and 26, a first memory cell MC1 may be provided between a bit pillar 85 and a first wordline 86, and a second memory cell MC2 may be provided between the bit pillar 85 and a second wordline 87. The first memory cell MC1 may include a first resistance changeable element R1 97A and a first schottky diode SD1, and the second memory cell MC2 may include a second resistance changeable element R2 97B and a second schottky diode SD2.

The first schottky diode SD1 may be connected in series to the first resistance changeable element R1 97A. The first schottky diode SD1 may include a portion of the first wordline 86, a first interfacial layer 91A on the first wordline 86, and a first metal silicide layer 93A on the first interfacial layer 91A. A first electrode 95A may be disposed between the first resistance changeable element R1 97A and the first metal silicide layer 93A. The first wordline 86, the first interfacial layer 91A, the first metal silicide layer 93A, and the first electrode 95A may be disposed between the first and second insulating layers 21 and 22.

The second schottky diode SD2 may be connected in series to the second resistance changeable element R2 97B. The second schottky diode SD2 may include a portion of the second wordline 87, a second interfacial layer 91B on the second wordline 87, and a second metal silicide layer 93B on the second interfacial layer 91B. A second electrode 95B may be disposed between the second resistance changeable element R2 97B and the second metal silicide layer 93B. The second wordline 87, the second interfacial layer 91B, the second metal silicide layer 93B, and the second electrode 95B may be disposed between the second insulating layer 22 and a third insulating layer 23.

Embodiment 7

FIGS. 27 to 36 are perspective views illustrating operations of fabricating a non-volatile memory device according to seventh embodiments of inventive concepts.

Figure 27:
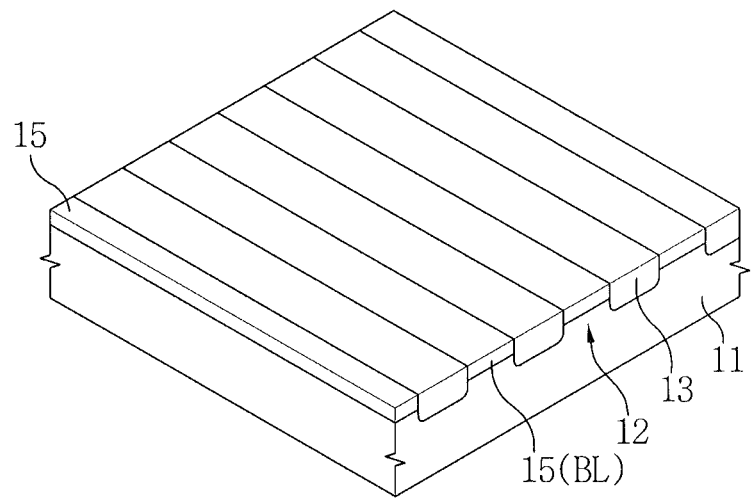
FIGS. 27 to 36 are perspective views illustrating portions of fabricating a non-volatile memory device according to seventh embodiments of inventive concepts.

Referring to FIG. 27, an isolation layer 13 defining an active region(s) 12 may be formed in a predetermined region(s) of a semiconductor substrate 11. A bit line(s) 15 may be formed in the active region(s) 12. A plurality of the bit lines 15 may be formed in parallel on one surface of the semiconductor substrate 11.

The semiconductor substrate 11 may be a silicon wafer or a silicon on insulator (SOI) wafer. For example, the semiconductor substrate 11 may be a single crystal silicon wafer doped with P-type impurities. The isolation layer 13 may be formed using a shallow trench isolation (STI) technique. The isolation layer 13 may include an insulating layer such as a silicon oxide layer, a silicon nitride layer, a silicon oxynitride layer, or a combination thereof. The bit lines 15 may be formed by implanting N-type impurities into the active region 12.

In some other embodiments, each bit line 15 may include a metal layer or a metal silicide layer. Further, each bit line 15 may be formed in an insulating layer (not shown) on the semiconductor substrate 11.

Figure 28:
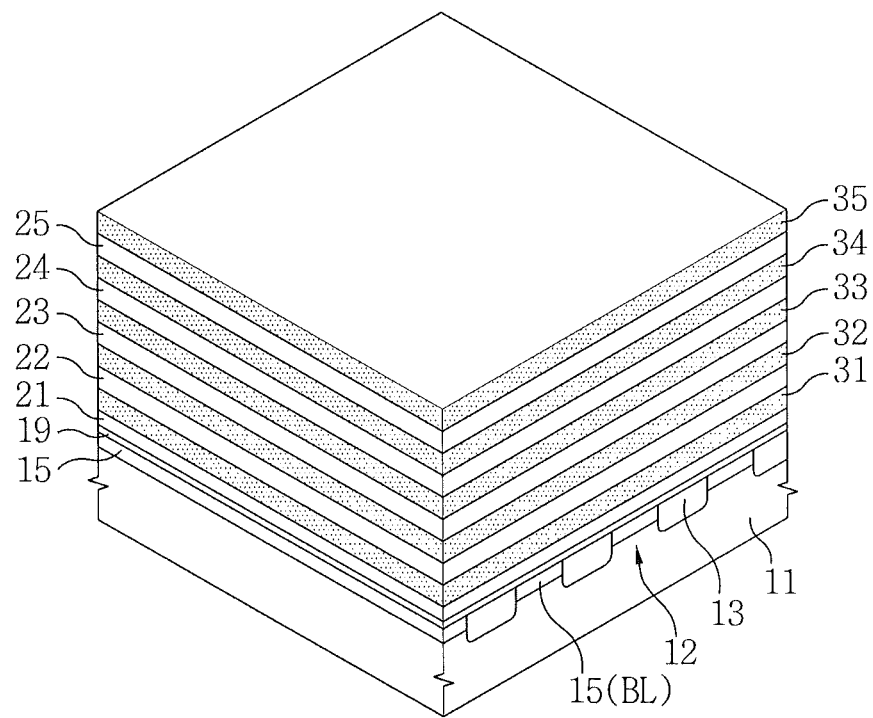

Referring to FIG. 28, a buffer oxide layer 19 may be formed on the semiconductor substrate 11 having the bit lines 15. The buffer oxide layer 19 may cover the bit lines 15 and the isolation layer 13. The buffer oxide layer 19 may be a silicon oxide layer formed by a chemical vapor deposition (CVD) technique.

Insulating layers 21 to 25 and sacrificial layers 31 to 35 may be alternatingly and repeatedly formed on the buffer oxide layer 19. The sacrificial layers 31 to 35 may be material layers having etch selectivities with respect to the insulating layers 21 to 25. For example, the insulating layers 21 to 25 may be nitride layers such as silicon nitride layers. In this case, the sacrificial layers 31 to 35 may be silicon oxide layers.

A first insulating layer 21 may be formed on the buffer oxide layer 19 using a CVD technique. A first sacrificial layer 31 may be formed on the first insulating layer 21. A second insulating layer 22 may be formed on the first sacrificial layer 31. A second sacrificial layer 32 may be formed on the second insulating layer 22. A third insulating layer 23 may be formed on the second sacrificial layer 32. A third sacrificial layer 33 may be formed on the third insulating layer 23. A fourth insulating layer 24 may be formed on the third sacrificial layer 33. A fourth sacrificial layer 34 may be formed on the fourth insulating layer 24. A fifth insulating layer 25 may be formed on the fourth sacrificial layer 34. A fifth sacrificial layer 35 may be formed on the fifth insulating layer 25.

Figure 29:
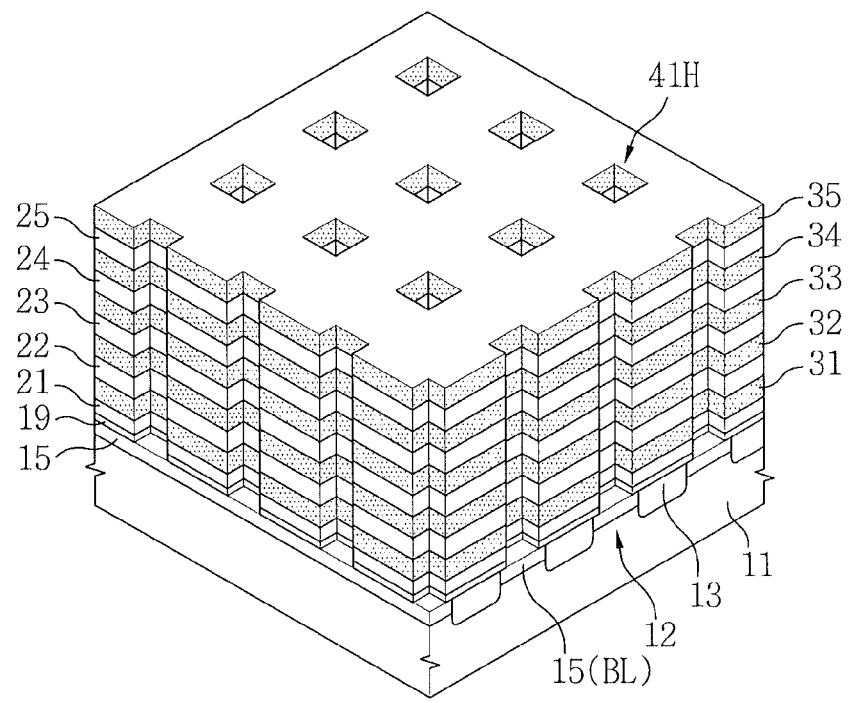

Referring to FIG. 29, bit contact holes 41H exposing respective bit lines 15 through the sacrificial layers 31 to 35, the insulating layers 21 to 25, and the buffer oxide layer 19 may be formed. A plurality of the bit contact holes 41H may be formed at regular intervals along the bit lines 15. Each bit contact hole 41H may be perpendicular with respect to a surface of the semiconductor substrate 11. Each bit contact hole 41H may be formed in various shapes such as a reverse-trapezoid in which an upper width is larger than a lower width. However, for ease of descriptions, the upper and the lower widths will be shown/described as being the same.

Figure 30:
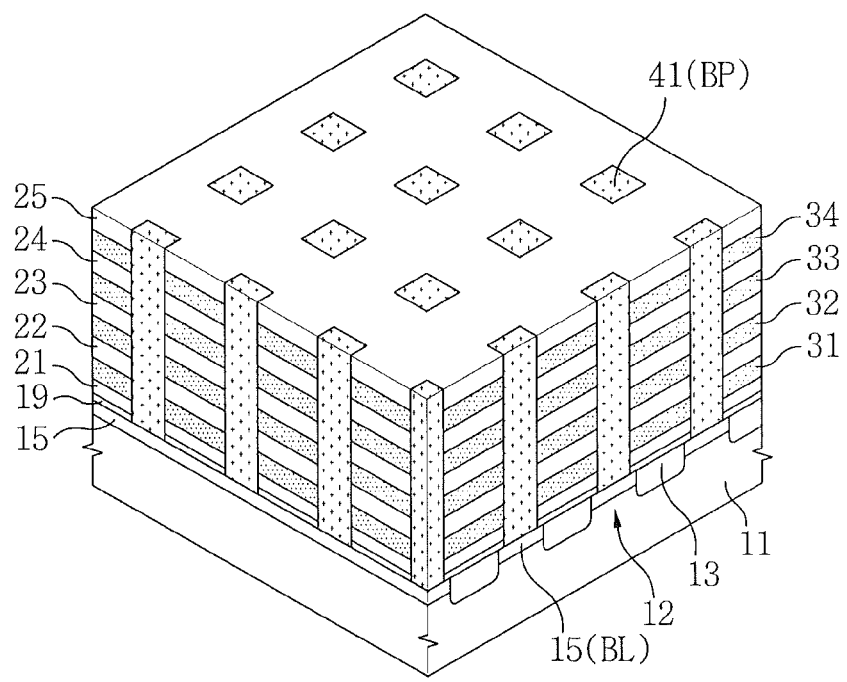

Referring to FIG. 30, a bit pillar BP 41 filling the bit contact hole 41H may be formed. The bit pillars 41 may be formed using a thin film forming process and a chemical mechanical polishing (CMP) process. The fifth sacrificial layer 35 may be removed during the formation of the bit pillars 41, and thus a top surface of the fifth insulating layer 25 may be exposed. Each bit pillar 41 may include a semiconductor layer doped with impurities at a first concentration. For example, each bit pillar 41 may be an N-type polysilicon layer or a P-type polysilicon pillar.

Figure 31:
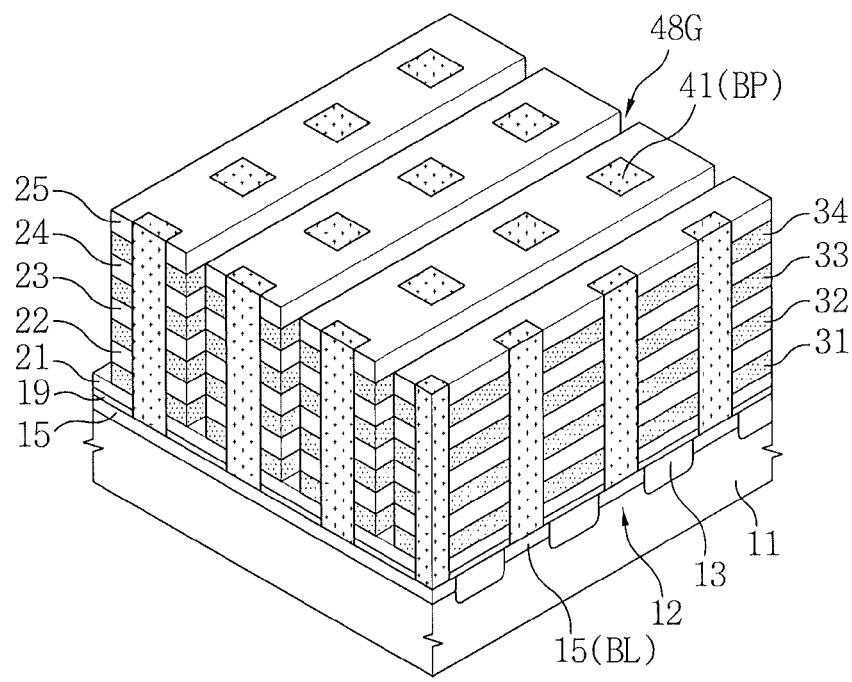

Referring to FIG. 31, the second to fifth insulating layers 22 to 25 and the first to fourth sacrificial layers 31 to 34 may be patterned, thereby forming a first grooves 48G. The first grooves 48G may cross the bit lines 15. The plurality of first grooves 48G may be parallel. The first to fourth sacrificial layers 31 to 34 may be exposed through sidewalls of the first grooves 48G.

Figure 32:
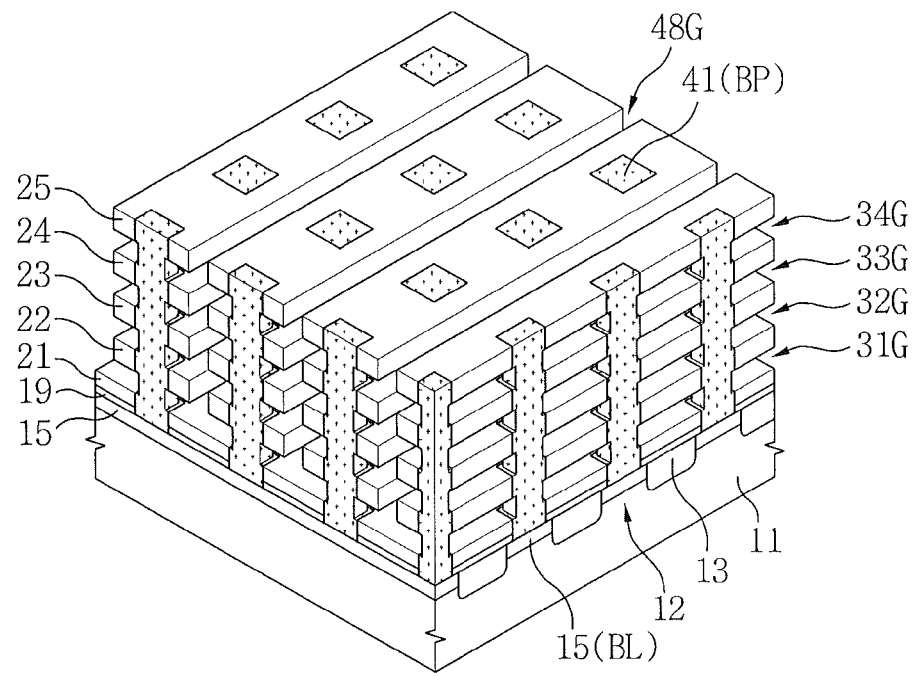

Referring to FIGS. 5 and 32, the first to fourth sacrificial layers 31 to 34 may be removed, thereby forming openings 31G to 34G. The openings 31G to 34G may be formed between the insulating layers 21 to 25 using an isotropic etching process. Portions of the sidewalls of the bit pillars 41 may be exposed in the openings 31G to 34G.

Exposed portions of the sidewalls of the bit pillar 41 may be partially etched during the formation of the openings 31G to 34G. In this case, as shown in FIG. 5, recess regions 41R may be formed in the sidewalls of the bit pillars 41. The recess regions 41R may be self-aligned with the openings 31G to 34G. In other words, the recess regions 41R may be formed between adjacent ones of the insulating layers 21 to 25.

Figure 33:
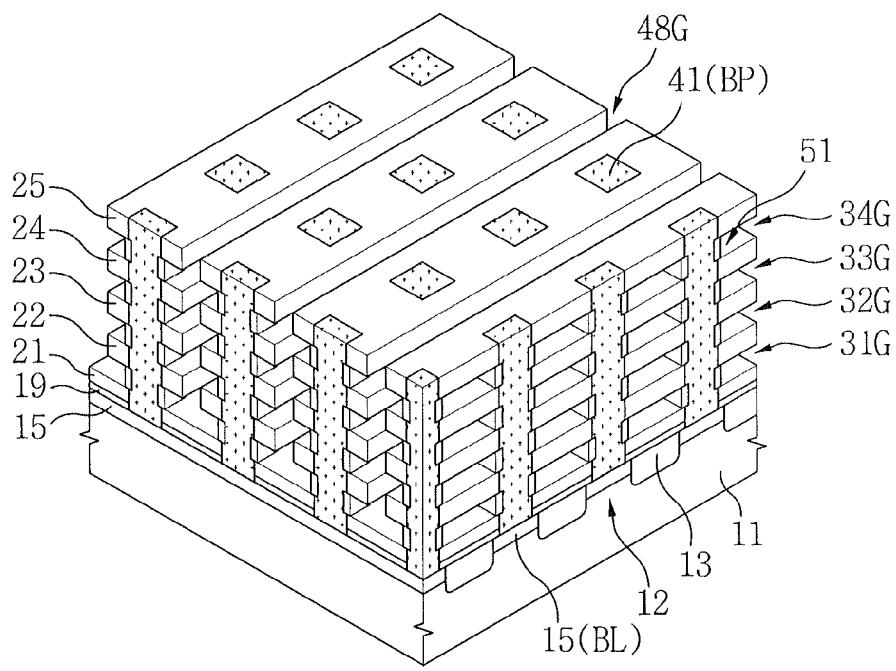

Referring to FIG. 33, interfacial layers 51 may be formed on the sidewalls of the bit pillars 41. Each interfacial layer 51 may be formed of a SEG layer. Each interfacial layer 51 may be an intrinsic semiconductor layer. The interfacial layers 51 may fill the recess regions 41R. The interfacial layers 51 may be self-aligned with the openings 31G to 34G. Further, the interfacial layers 51 may extend between adjacent ones of the insulating layers 21 to 25.

In some embodiments, the interfacial layers 51 may be formed of a semiconductor layers doped with impurities at a second concentration lower than the first concentration. Each interfacial layer 51 may include an SEG layer, an Si layer, an SiGe layer, and/or an SiC layer.

Figure 34:
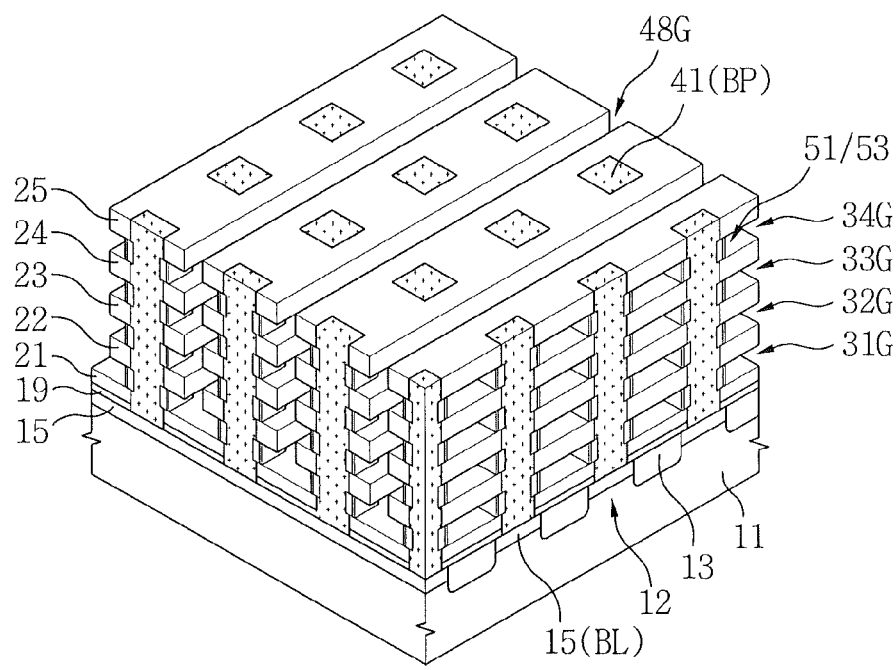

Referring to FIGS. 6 and 34, metal silicide layers 53 may be formed on the interfacial layers 51. Each metal silicide layer 53 may be formed along a surface of a respective interfacial layer 51. The metal silicide layers 53 may be confined to respective openings 31G to 34G. The metal silicide layers 53, the interfacial layers 51, and the bit pillars 41 may provide respective schottky diodes. Each metal silicide layer 53 may include a TiSi layer, a ZrSi layer, CoSi layer, a WSi layer, a NiSi layer, PdSi layer, a PtSi layer, a HfSi layer, and/or a MoSi layer.

Figure 35:
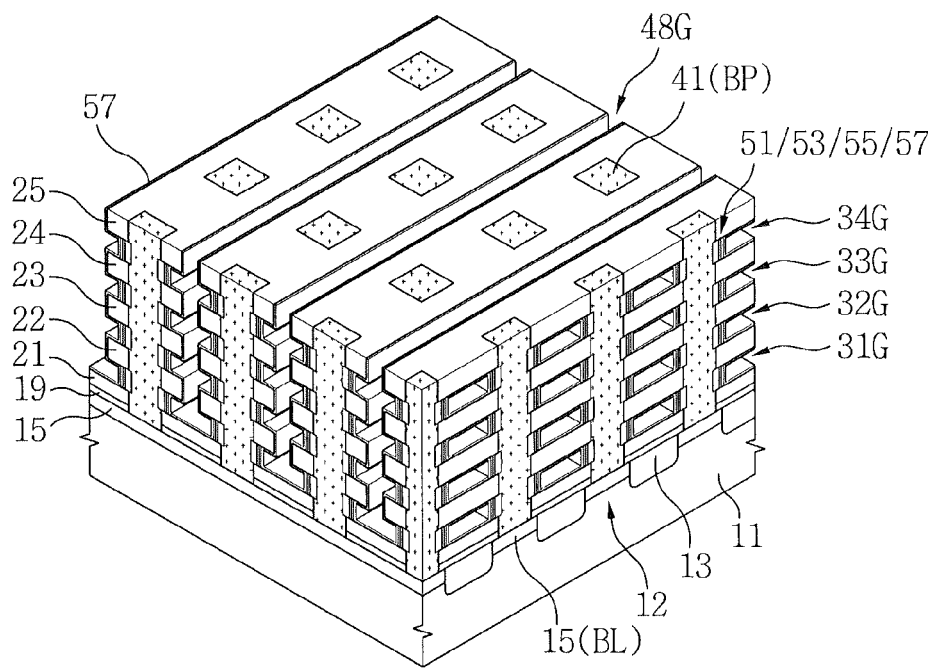

Referring to FIGS. 7 and 35, an electrode 55 and a resistance changeable element 57 may be formed on metal silicide layer 53. The resistance changeable element/layer 57 may conformally cover exposed surfaces of insulating layers 21 to 25 and exposed surfaces of electrodes 55. The resistance changeable element 57 may include a TMO layer, a phase change material layer, a solid electrolyte layer or a polymer layer. For example, the resistance changeable element/layer 57 may be a TiO layer, a TaO layer, a NiO layer, a ZrO layer, and/or a HfO layer.

During the formation of the resistance changeable element/layer 57, the electrodes 55 may be formed by oxidizing a metal material in the metal silicide layer 53. Each electrode 55 may be formed between a respective metal silicide layer 53 and the resistance changeable element/layer 57. In this case, each electrode 55 may be self-aligned with the respective metal silicide layer 53. Each electrode 55 may include a TiSiO layer, a TiO layer, a ZrO layer, a CoO layer, a WO layer, a NiO layer, a PdO layer and/or a PtO layer. In some embodiments, each electrode 55 may be formed by depositing a CuO layer, an IZO layer, and/or an ITO layer.

Figure 36:
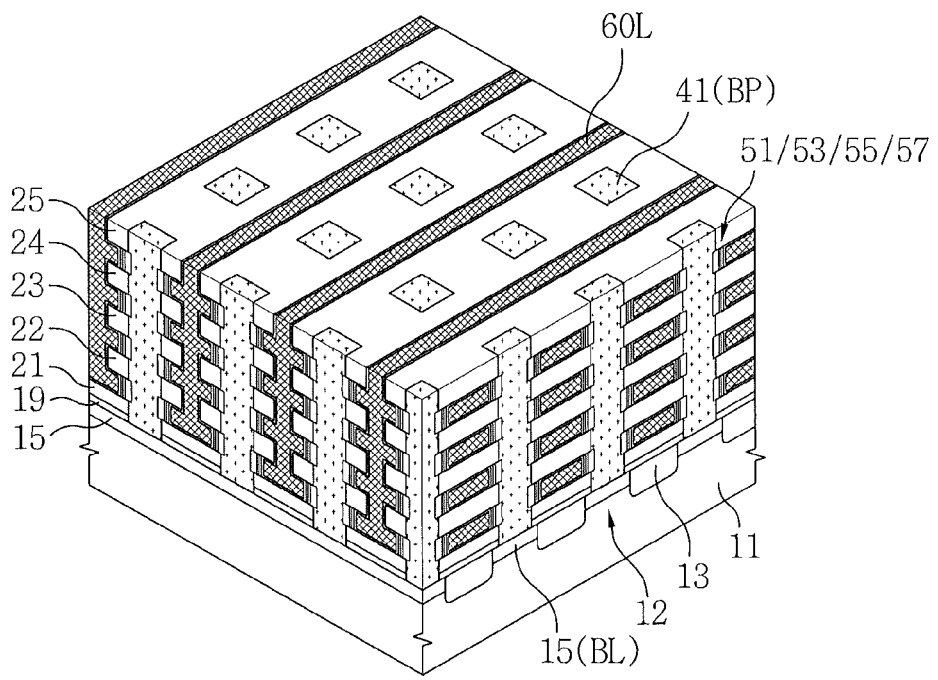

Referring to FIG. 36, word conductive layer(s) 60L may completely fill the openings 31G to 34G and the first groove 48G. The word conductive layer(s) 60L may be a low-temperature conductive layer(s) formed at a lower temperature than a critical degradation temperature of the resistance changeable element 57. The word conductive layer(s) 60L may include a Ru layer(s), and/or a W layer(s).

For example, the critical degradation temperature of a resistance changeable element 57 may be 450° C. An electrical characteristic of a resistance changeable element 57 may degrade when exposed to a higher temperature than the critical degradation temperature. Thus, the word conductive layer 60L may be formed using a physical vapor deposition (PVD) technique performed at room temperature or a chemical vapor deposition (CVD) technique performed at 400° C. or less.

Referring again to FIG. 1, the word conductive layer 60L may be patterned, thereby forming wordlines 61 to 64 and second grooves 60G. During the patterning of the word conductive layer 60L, portions of resistance changeable element/layer 57 may be partially removed and partially retained between the insulating layers 21 to 25.

Embodiment 8

Figure 37:
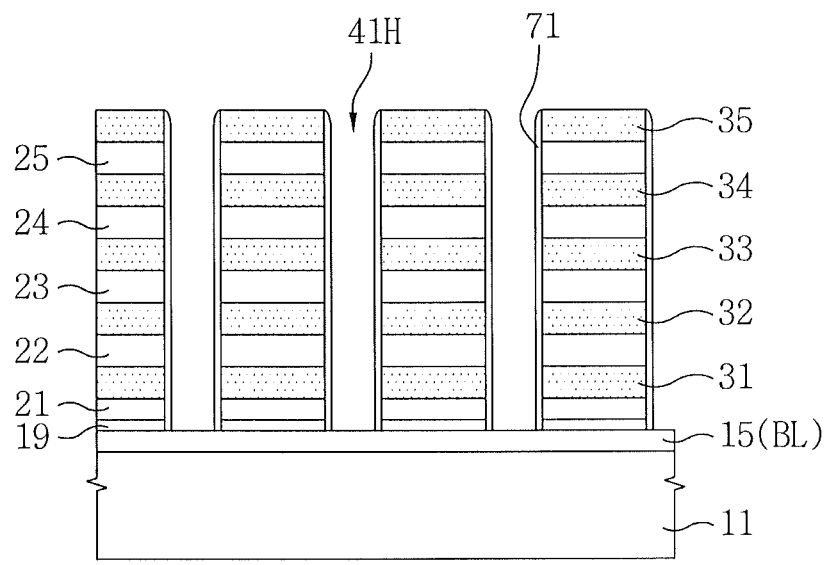
FIGS. 37 to 39 are cross-sectional and perspective views, which illustrate operations of fabricating a non-volatile memory device according to eighth embodiments of inventive concepts.
Figure 38:
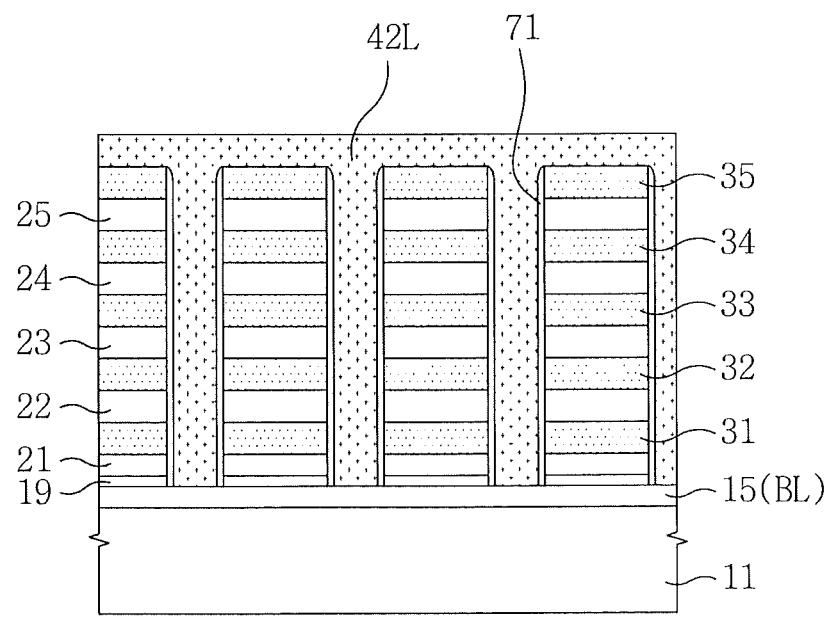
Figure 39:
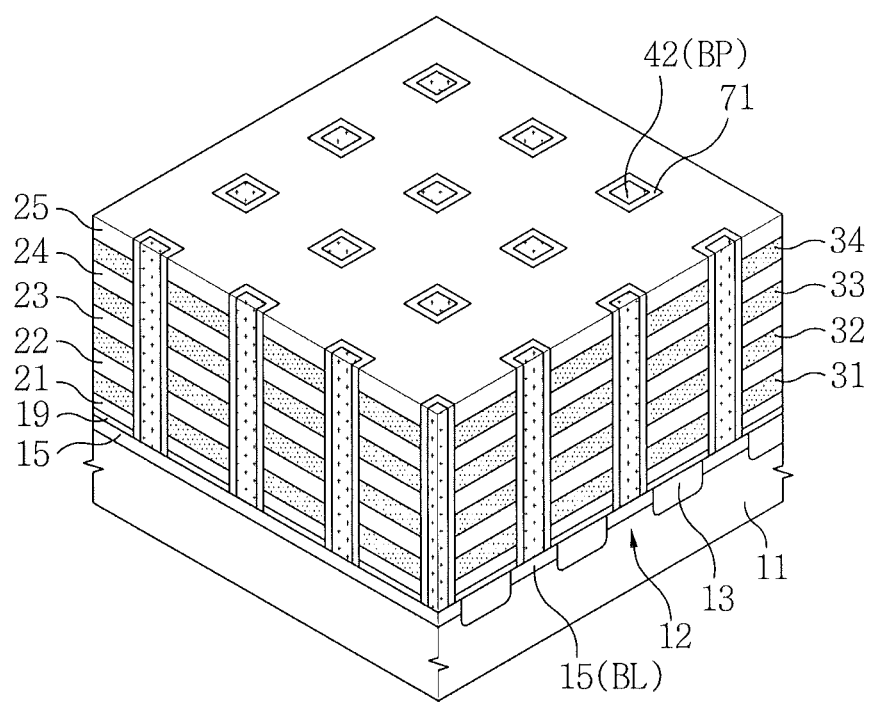

FIGS. 37 to 39 are cross-sectional views and a perspective view, which illustrate operations of fabricating a non-volatile memory device according to eighth embodiments of inventive concepts.

Referring to FIG. 37, a buffer oxide layer 19 may be formed on a semiconductor substrate 11 having a bit lines 15. Insulating layers 21 to 25 and sacrificial layers 31 to 35 may be alternatingly and repeatedly formed on the buffer oxide layer 19. Bit contact holes 41H may be formed exposing the bit line 15 through the sacrificial layers 31 to 35, the insulating layers 21 to 25, and the buffer oxide layer 19.

An interfacial layer 71 may be formed on sidewalls of the bit contact holes 41H.

Referring to FIG. 38, bit semiconductor layer 42L may be formed completely filling the bit contact holes 41H. The bit semiconductor layer 42L may include a semiconductor layer doped with impurities at a first concentration. For example, the bit semiconductor layer 42L may be an N-type polysilicon layer or a P-type polysilicon layer.

Referring to FIG. 39, bit pillars 42 may be formed using a planarization process. Interfacial layers 71 may surround sidewalls of bit pillars 42. Each interfacial layer 71 may be an intrinsic semiconductor layer or a semiconductor layer doped with impurities at a second concentration lower than the first concentration. For example, each interfacial layer 71 may be an undoped polysilicon layer.

Afterwards, a non-volatile memory device similar to that shown in FIG. 9 may be formed in subsequent processes.

Embodiment 9

Figure 40:
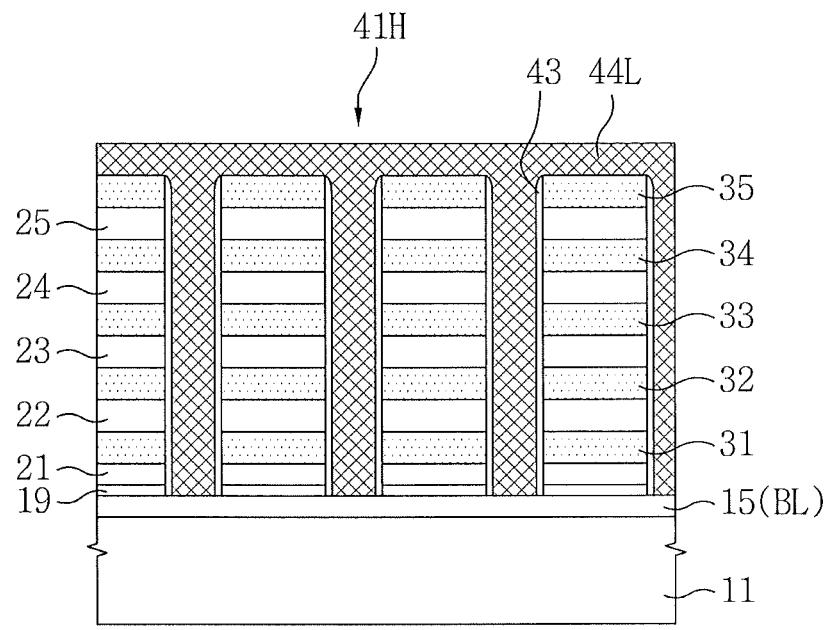
FIGS. 40 and 41 are cross-sectional and perspective views, which illustrate operations of fabricating a non-volatile memory device according to ninth embodiments of inventive concepts, respectively.
Figure 41:
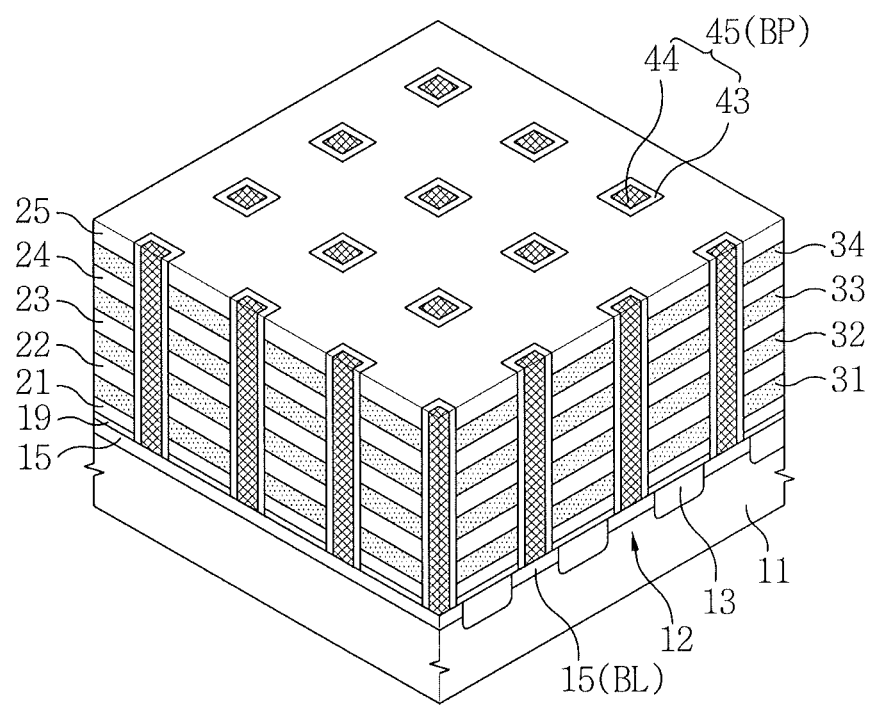

FIGS. 40 and 41 are respectively cross-sectional and perspective views, which illustrate operations of fabricating a non-volatile memory device according to ninth embodiments of inventive concepts.

Referring to FIG. 40, a buffer oxide layer 19 may be formed on a semiconductor substrate 11 having a bit line(s) 15. Insulating layers 21 to 25 and sacrificial layers 31 to 35 may be alternatingly and repeatedly formed on the buffer oxide layer 19. Bit contact holes 41H may be formed exposing the bit line(s) 15 through the sacrificial layers 31 to 35, the insulating layers 21 to 25, and the buffer oxide layer 19.

Bit semiconductor layers 43 may be formed on sidewalls of bit contact holes 41H. A bit metal layer 44L filling the bit contact holes 41H may be formed. The bit semiconductor layer 43 may include a semiconductor layer doped with impurities at a first concentration. For example, each bit semiconductor layer 43 may be an N-type polysilicon layer or a P-type polysilicon layer. The bit metal layer 44L may be a metal layer providing relatively high conductivity, such as a TiN layer.

Referring to FIG. 41, metal pillars 44 may be formed using a planarization process. Each metal pillar 44 and respective bit semiconductor layer 43 surrounding the metal pillar 44 may provide a bit pillar 45.

Afterwards, a non-volatile memory device similar to that shown in FIG. 12 may be formed in subsequent processes.

Embodiment 10

Figure 42:
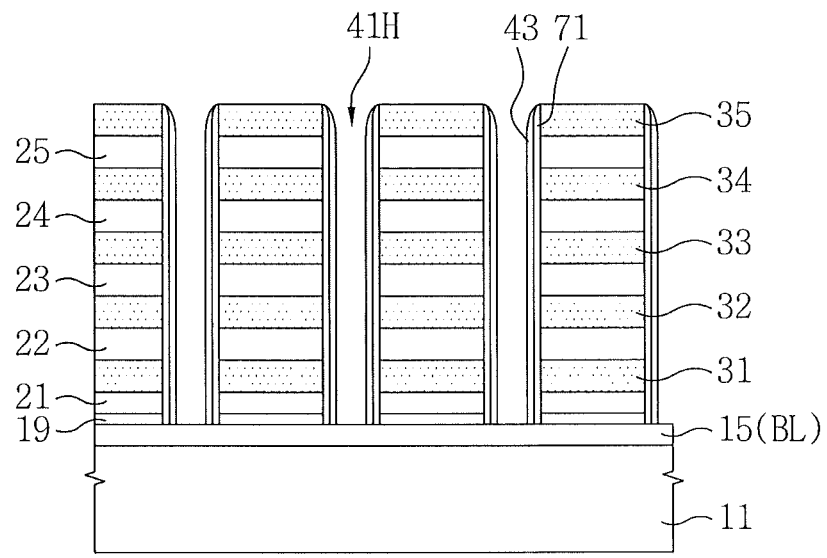
FIGS. 42 to 44 are cross-sectional and perspective views, which illustrate operations of fabricating a non-volatile memory device according to tenth embodiments of inventive concepts, respectively.
Figure 43:
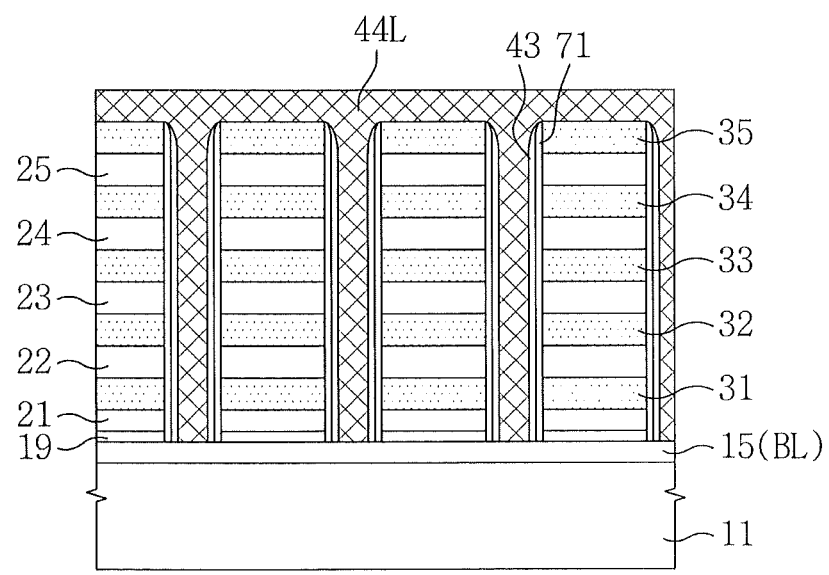
Figure 44:
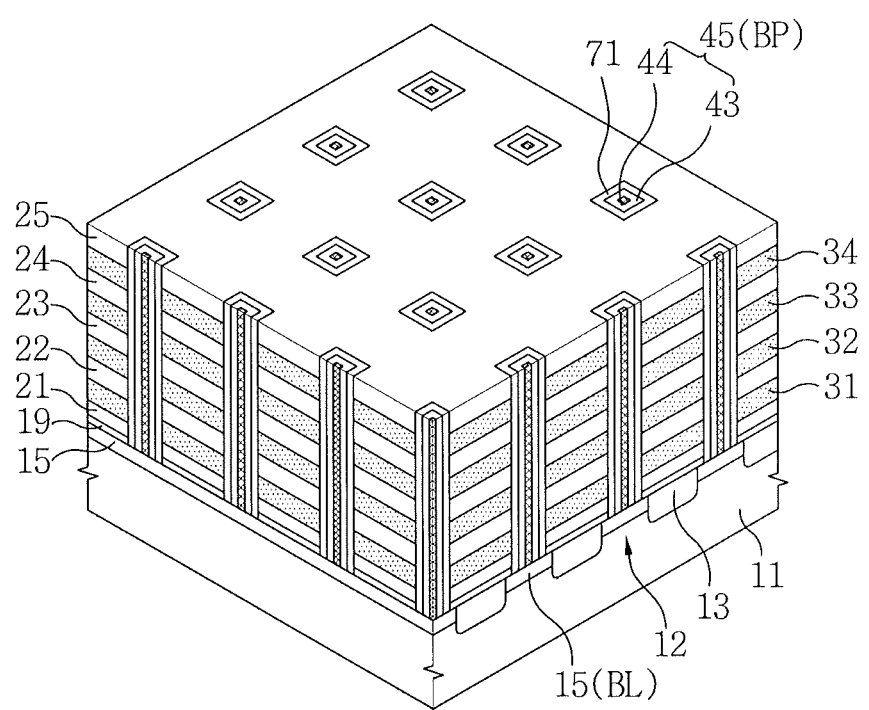

FIGS. 42 to 44 are cross-sectional and perspective views, which illustrate operations of fabricating a non-volatile memory device according to tenth embodiments of inventive concepts.

Referring to FIGS. 42 and 43, a buffer oxide layer 19 may be formed on a semiconductor substrate 11 having a bit line(s) 15. Insulating layers 21 to 25 and sacrificial layers 31 to 35 may be alternatingly and repeatedly formed on the buffer oxide layer 19. Bit contact holes 41H exposing the bit line(s) 15 through the sacrificial layers 31 to 35, the insulating layers 21 to 25, and the buffer oxide layer 19 may be formed.

Interfacial layers 71 may be formed on sidewalls of the bit contact holes 41H. Bit semiconductor layers 43 may be formed on the interfacial layers 71. The bit semiconductor layer 43 may include a semiconductor layer doped with impurities at a first concentration. Each interfacial layer 71 may be an intrinsic semiconductor layer or a semiconductor layer doped with impurities at a second concentration lower than the first concentration. A bit metal layer 44L completely filling the bit contact holes 41H may be formed.

Referring to FIG. 44, metal pillars 44 may be formed using a planarization process. Each metal pillar 44 and bit semiconductor layer 43 surrounding the metal pillar 44 may provide a bit pillar 45. Each interfacial layer 71 may surround a sidewall of a respective bit pillar 45.

Subsequently, a non-volatile memory device similar to that shown in FIG. 15 may be formed in subsequent processes.

Embodiment 11

FIGS. 45 to 50 are perspective views illustrating operations of fabricating a non-volatile memory device according to eleventh embodiments of inventive concepts.

Figure 45:
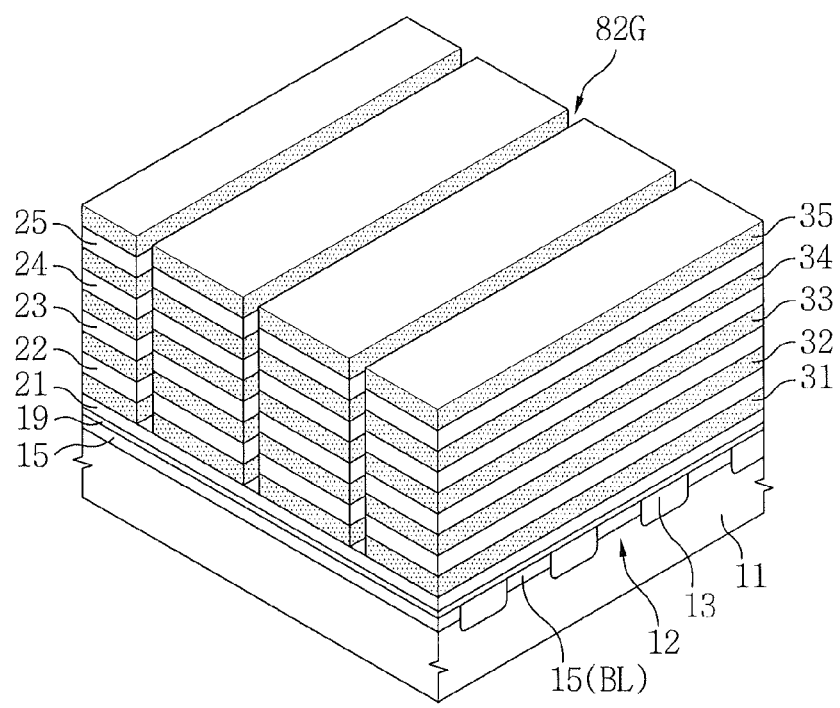
FIGS. 45 to 50 are perspective views illustrating operations of fabricating a non-volatile memory device according to eleventh embodiments of inventive concepts.
Figure 46:
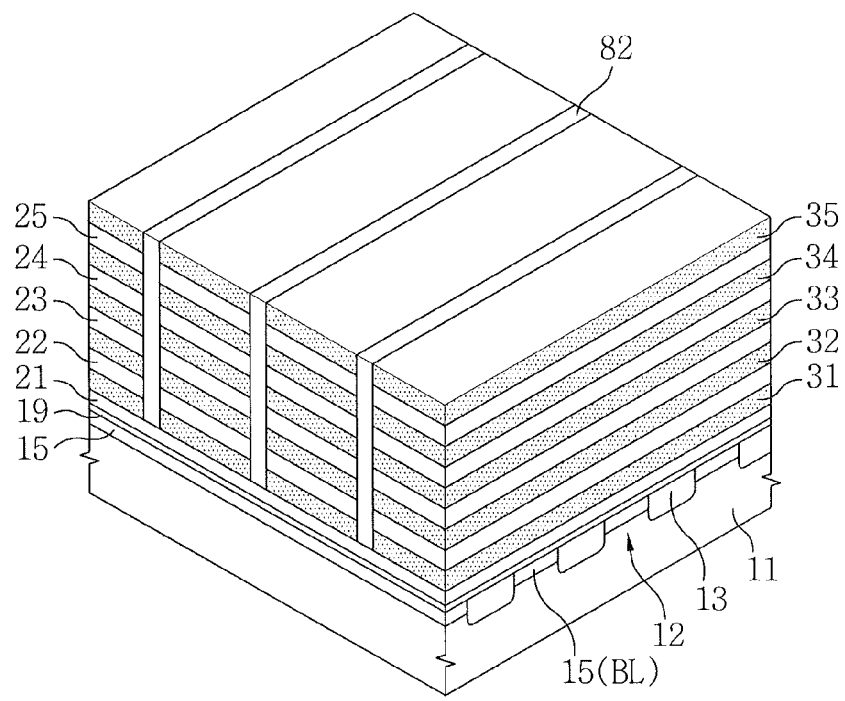

Referring to FIGS. 45 and 46, a buffer oxide layer 19 may be formed on a semiconductor substrate 11 having a bit line(s) 15. Insulating layers 21 to 25 and sacrificial layers 31 to 35 may be alternatingly and repeatedly formed on the buffer oxide layer 19. The sacrificial layers 31 to 35 and the second to fifth insulating layers 22 to 25 may be patterned, thereby forming first grooves 82G. Insulating barriers 82 filling the first grooves 82G may be formed. The insulating barriers 82 may be insulating layers having etch selectivities with respect to the sacrificial layers 31 to 35.

Figure 47:
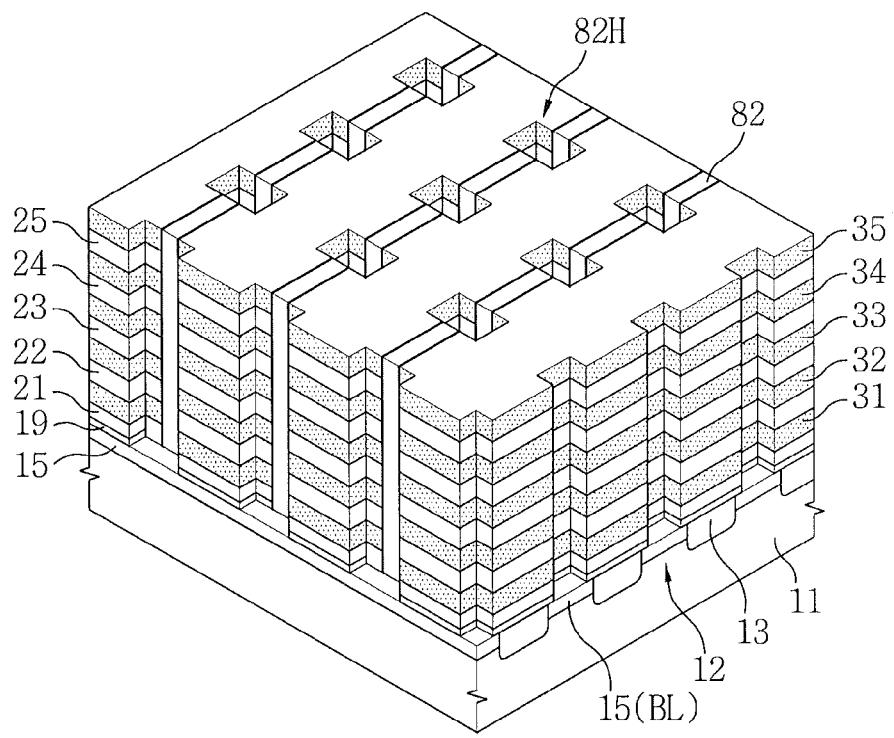
Figure 48:
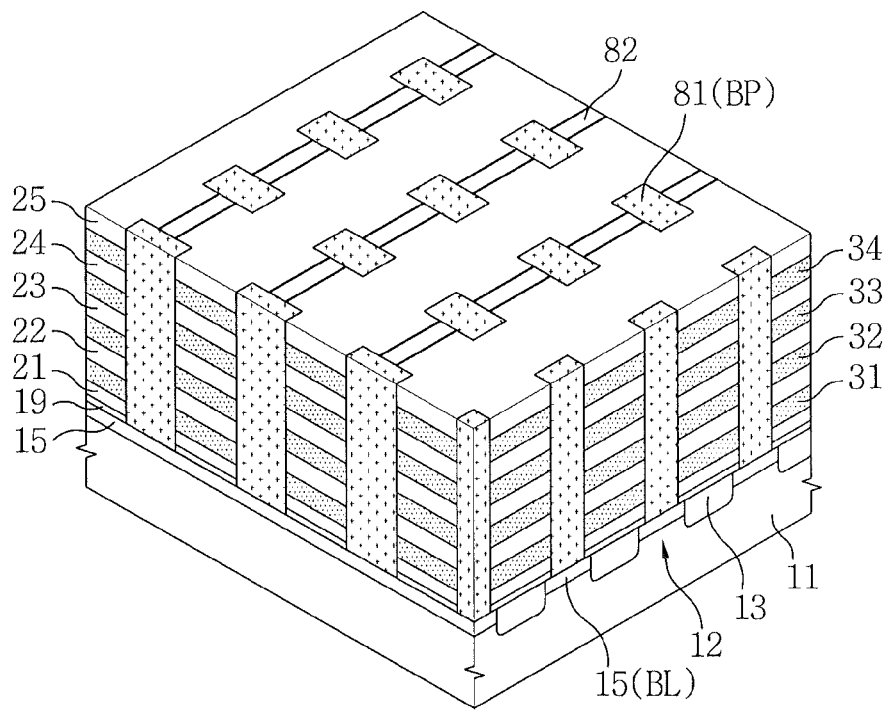

Referring to FIGS. 47 and 48, bit contact holes 82H exposing respective bit lines 15 through the insulating barriers 82, the sacrificial layers 31 to 35, the insulating layers 21 to 25, and the buffer oxide layer 19 may be formed. Bit pillars 81 filling the bit contact holes 82H may be formed. Each bit pillar 81 may include a semiconductor layer doped with impurities at a first concentration. The fifth sacrificial layer 35 may be removed during the formation of the bit pillars 81. For example, a bit pillar layer may be formed on fifth sacrificial layer 35 and in bit contact holes 82H, and the bit pillar layer may be planarized to form separate bit pillars 81, thereby removing fifth sacrificial layer 35.

Figure 49:
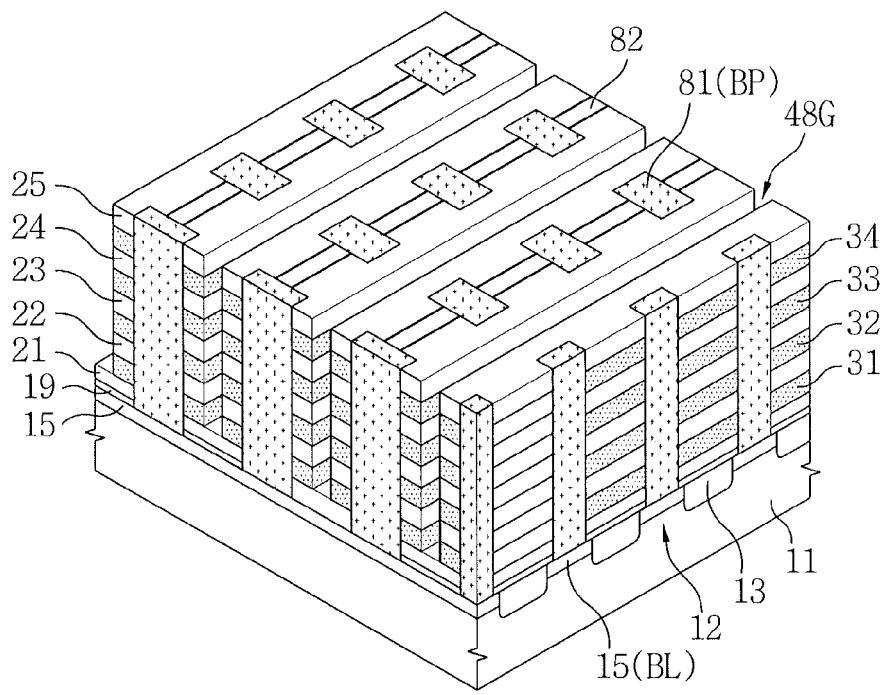
Figure 50:
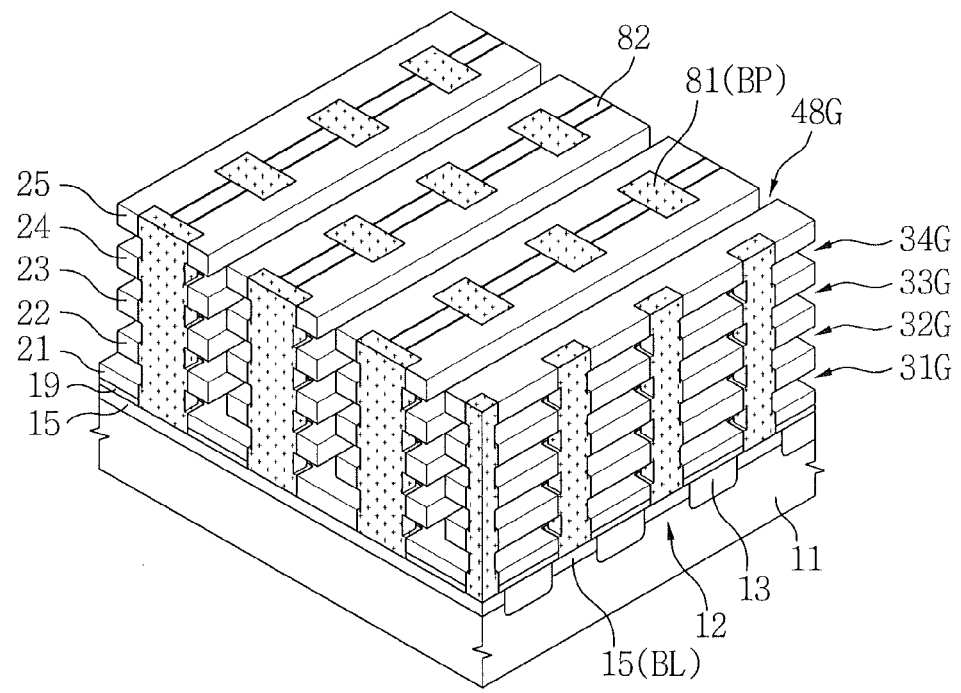

Referring to FIGS. 49 and 50, the second to fifth insulating layers 22 to 25 and the first to fourth sacrificial layers 31 to 34 may be patterned, thereby forming second grooves 48G. Sidewalls of the first to fourth sacrificial layers 31 to 34 may be exposed by the second grooves 48G. The first to fourth sacrificial layers 31 to 34 may be removed, thereby forming openings 31G to 34G. Sidewalls of the bit pillars 81 may be exposed in the openings 31G to 34G.

Afterwards, a non-volatile memory device similar to that shown in FIG. 18 may be formed in subsequent process.

Embodiment 12

Figure 51:
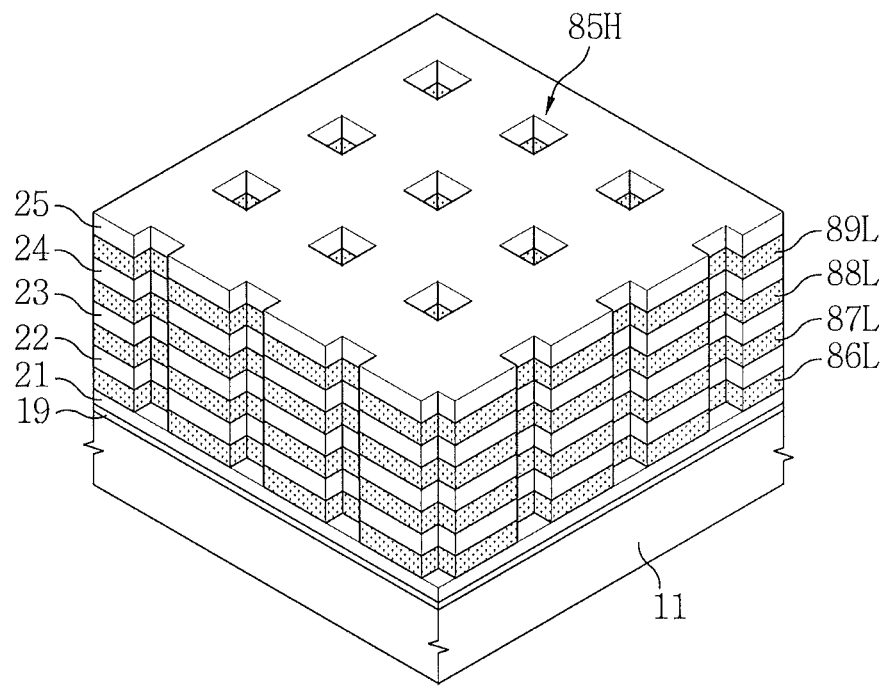
FIGS. 51 to 53 are perspective views illustrating operations of fabricating a non-volatile memory device according to twelfth embodiments of inventive concepts.
Figure 52:
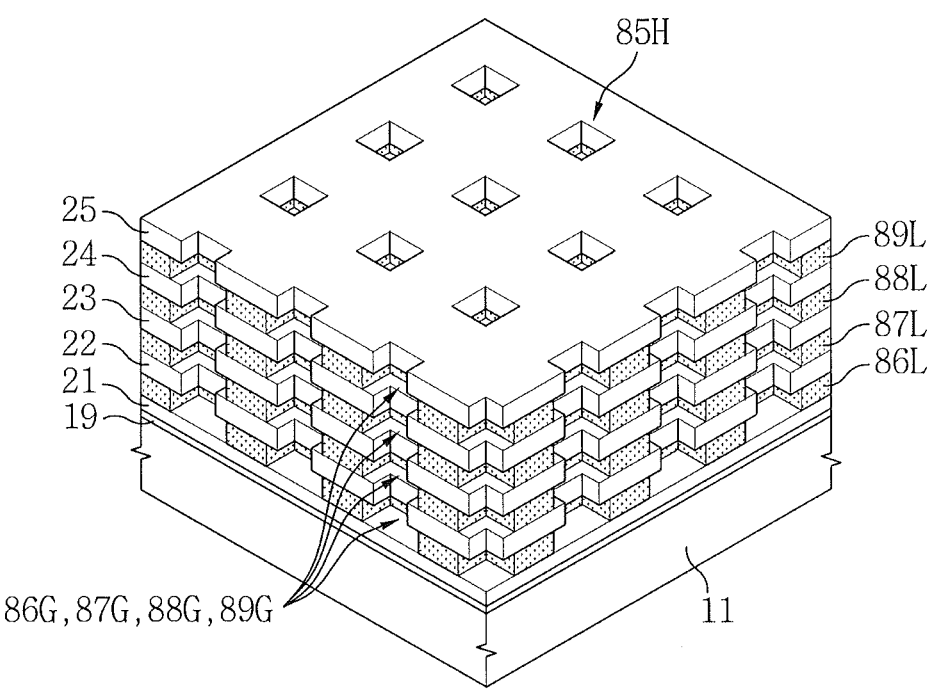
Figure 53:
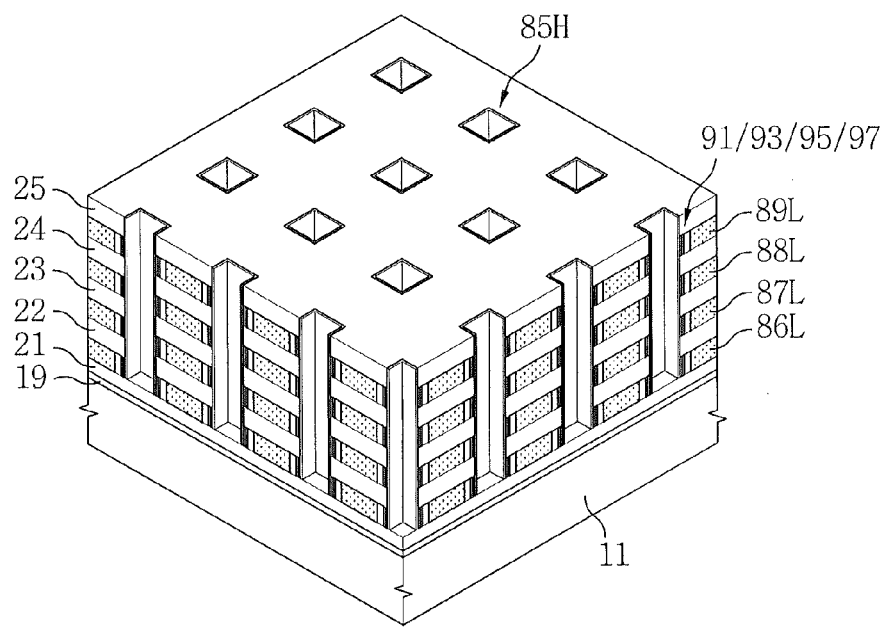

FIGS. 51 to 53 are perspective views illustrating operations of fabricating a non-volatile memory device according to twelfth embodiments of inventive concepts.

Referring to FIGS. 51 to 52, a buffer oxide layer 19 may be formed on a semiconductor substrate 11. Insulating layers 21 to 25 and word conductive layers 86L to 89L may be alternatingly and repeatedly formed on the buffer oxide layer 19. The word conductive layers 86L to 89L and the second to fifth insulating layers 22 to 25 may be patterned, thereby forming bit contact holes 85H. Sidewalls of the word conductive layers 86L to 89L may be exposed by the bit contact holes 85H.

Each word conductive layers 86L to 89L may include a semiconductor layer doped with impurities at a first concentration. For example, the word conductive layers 86L to 89L may be N-type polysilicon layers or P-type polysilicon layers. The insulating layers 21 to 25 may be insulating layers having etch selectivities with respect to the word conductive layers 86L to 89L.

The word conductive layers 86L to 89L may be partially removed using an isotropic etching process, thereby forming recesses 86G to 89G. The recesses 86G to 89G may be formed between the insulating layers 21 to 25. Sidewalls of the word conductive layers 86L to 89L may be exposed in the recesses 86G to 89G.

Referring to FIG. 53, interfacial layers 91 may be formed in the recesses 86G to 89G. The interfacial layers 91 may be in contact with the sidewalls of the respective word conductive layers 86L to 89L. Metal silicide layers 93 may be formed on the interfacial layers 91. Electrodes 95 and resistance changeable elements 97 may be formed on the metal silicide layers 93. The resistance changeable elements 97 may cover the sidewalls of the bit contact holes 85H.

Afterwards, a non-volatile memory device similar to that shown in FIG. 24 may be formed in subsequent processes.

Embodiment 13

Figure 54:
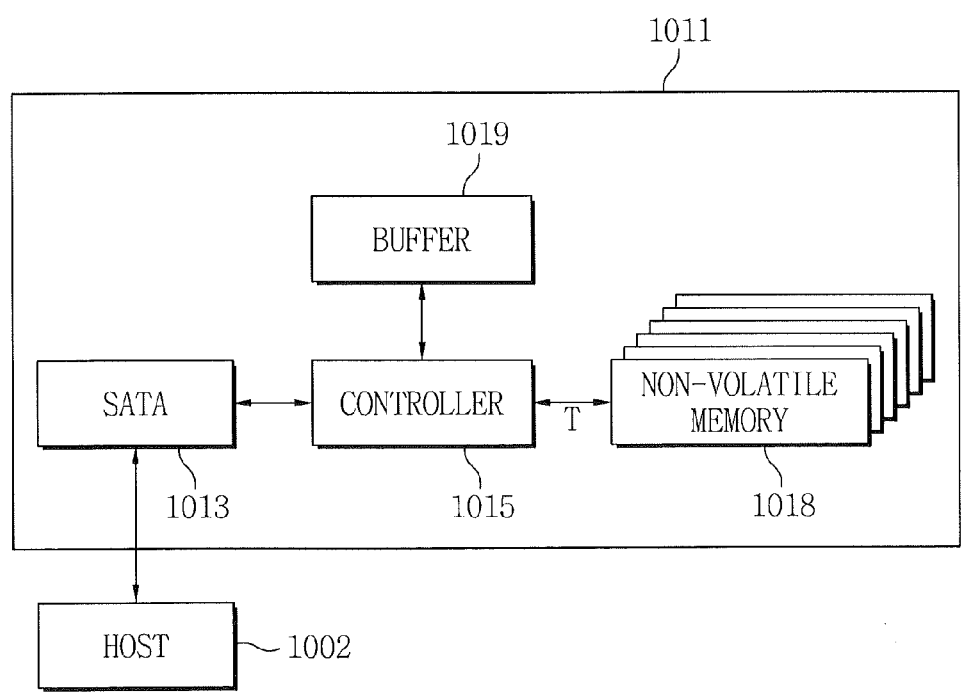
FIG. 54 is a block diagram of an electronic system according to thirteenth embodiments of inventive concepts.

FIG. 54 is a block diagram of an electronic system according to thirteenth embodiments of inventive concepts. The electronic system may be a data storage apparatus such as a solid state disk (SSD) 1011.

Referring to FIG. 54, the SSD 1011 may include an interface 1013, a controller 1015, a non-volatile memory 1018, and a buffer memory 1019. The non-volatile memory 1018 may include a semiconductor device similar to that described above with reference to FIGS. 1 to 53. For example, the non-volatile memory 1018 may include memory cells having a configuration similar to that of FIG. 1.

The SSD 1011 is a semiconductor device used to store data. The SSD 1011 may provide increased speed, reduced mechanical delay, reduced failure rate, reduced heat, reduced noise, and/or reduced weight and/or size compared with a hard disk drive (HDD). The SSD 1011 may be used in radio, telephones, smartphones notebook PCs, desktop PCs, MP3 players, and/or portable storage apparatuses.

The controller 1015 may be formed adjacent and electrically connected to the interface 1013. The controller 1015 may be a microprocessor including a memory controller and a buffer controller. The non-volatile memory 1018 may be formed adjacent and electrically connected to the controller 1015. A data storage capacity of the SSD 1011 may be provided by the non-volatile memory 1018. The buffer memory 1019 may be formed adjacent and electrically connected to the controller 1015.

The interface 1013 may be connected to a host 1002, and may serve to send and receive electrical signals such as data. For example, the interface 1013 may be a device using a specification such as serial advanced technology attachment (SATA), integrated drive electronics (IDE), small computer system interface (SCSI), and/or a combination thereof. The non-volatile memory 1018 may be connected to the interface 1013 via the controller 1015. The non-volatile memory 1018 may serve to store data received from the interface 1013. Even if a power supply to the SSD 1011 is interrupted, the data stored in the non-volatile memory 1018 may be retained.

The buffer memory 1019 may include a volatile memory. The volatile memory may be a dynamic random access memory (DRAM) and/or a static random access memory (SRAM). The buffer memory 1019 may exhibit a relatively faster operating speed than the non-volatile memory 1018.

A data processing speed of the interface 1013 may be relatively faster than the operating speed of the non-volatile memory 1018. Here, the buffer memory 1019 may serve to temporarily store data. The data received through the interface 1013 may be temporarily stored in the buffer memory 1019 via the controller 1015, and permanently stored in the non-volatile memory 1018 at a data write speed of the non-volatile memory 18. Frequently used data of the data stored in the non-volatile memory 1018 may be previously read and then temporarily stored in the buffer memory 1019. In other words, the buffer memory 1019 may serve to increase an effective operating speed of the SSD 1011 and/or reduce an error rate.

Embodiment 14

Figure 55:
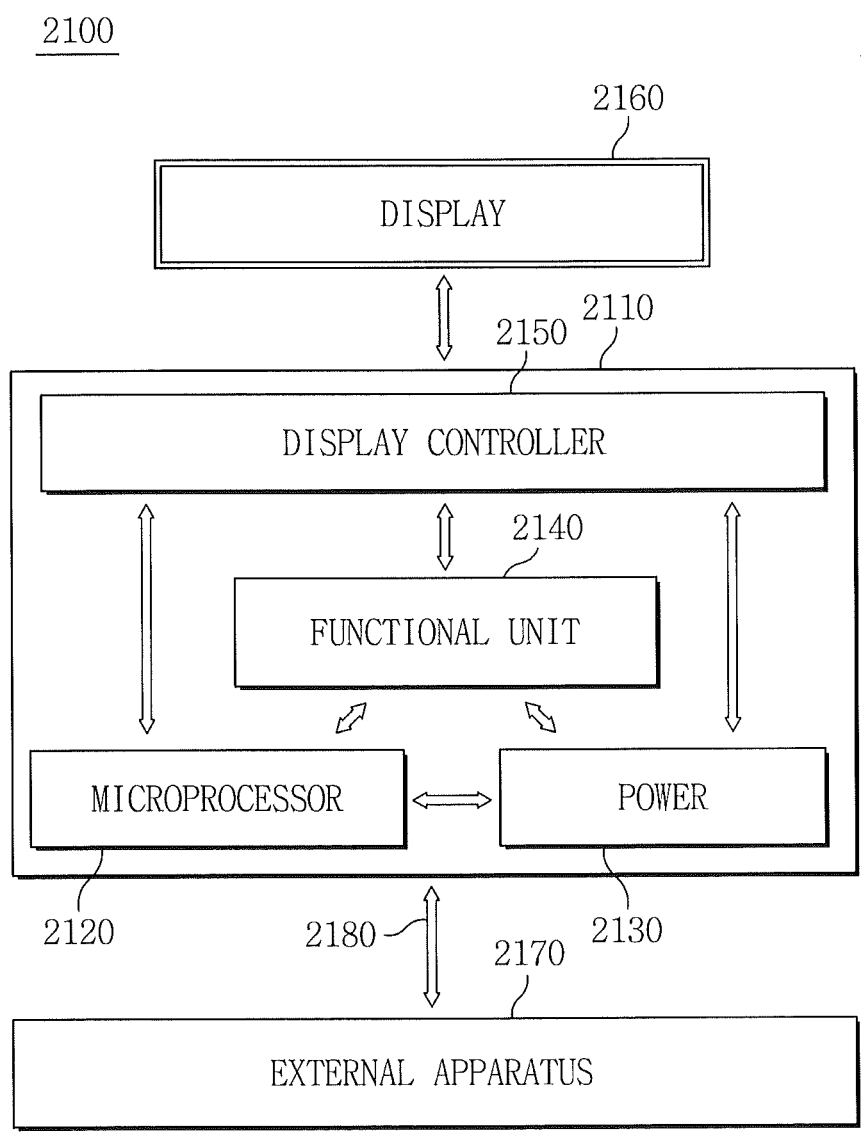
FIG. 55 is a block diagram of an electronic system according to fourteenth embodiments of inventive concepts.

FIG. 55 is a block diagram of an electronic system according to fourteenth embodiments of inventive concepts.

Referring to FIG. 55, a semiconductor device similar to that described with reference to FIGS. 1 to 53 may be applied to an electronic system 2100. The electronic system 2100 may include a body 2110, a micro processor unit 2120, a power unit 2130, a functional unit 2140, and a display controller unit 2150. The body 2110 may be a mother board provided/formed on a printed circuit board (PCB). The micro processor unit 2120, the power unit 2130, the functional unit 2140, and the display controller unit 2150 may be installed in the body 2110. A display unit 2160 may be disposed in or out of the body 2110. For example, the display unit 2160 may be disposed on a surface of the body 2110 to display an image processed by the display controller unit 2150.

The power unit 2130 may serve to distribute a predetermined voltage, which may be supplied from an external battery (not shown) and then branched according to a required level of voltage, to the micro processor unit 2120, the functional unit 2140, and the display controller unit 2150. The micro processor unit 2120 may receive voltage from the power unit 2130, and control the functional unit 2140 and the display unit 2160. The functional unit 2140 may perform various functions of the electronic system 2100. For example, if the electronic system 2100 is a mobile phone, the functional unit 2140 may include various components capable of performing a mobile function such: as dialing; providing the output of an image to the display unit 2160; and, providing the output of a sound to a speaker by communication with an external apparatus 2170. When a camera is installed together within the electronic system 2100, the functional unit 2140 may serve as a camera image processor.

In some embodiments, when the electronic system 2100 is connected to a memory card in order to increase capacity, the functional unit 2140 may include a memory card controller. The functional unit 2140 may send and/or receive signals to and/or from the external apparatus 2170 through a wired or wireless communication unit 2180. Further, if the electronic system 2100 uses a universal serial bus (USB) to expand its function, the functional unit 2140 may serve as an interface controller.

The semiconductor device similar to that described with reference to FIGS. 1 to 53 may be applied to at least one of the micro processor unit 2120 and/or the functional unit 2140. For example, the functional unit 2140 may include memory cells having a configuration similar to that shown in FIG. 1. In this case, the bit lines (15 of FIG. 1) and the wordlines (61, 62, 63 and 64 of FIG. 1) may be electrically connected to the micro processor unit 2120 via the body 2110.

According to inventive concepts, wordlines may be sequentially stacked on a substrate, bit pillars perpendicular to the substrate may extend through the wordlines, and memory cells may be provided between the bit pillar and the wordlines. Each memory cell may include a resistance changeable element and a schottky diode. The schottky diode may include an interfacial layer and a metal silicide layer on the interfacial layer. The interfacial layer may be an intrinsic semiconductor layer or a semiconductor layer doped with impurities at a relatively low concentration. As compared to conventional structures, the schottky diode may have a reduced leakage current due to the presence of the interfacial layer. In addition, the wordlines may be low-temperature conductive layers formed at lower deposition temperatures than a critical degradation temperature of the resistance changeable element. In other words, during the formation of the wordlines, degradation of the resistance changeable element can be reduced and/or prevented. As a result, non-volatile memory devices providing increased integration and/or improved operating characteristics may be realized.

Names and functions of other components shown or not shown by reference numerals in the drawings will be understood from other drawings and descriptions of the specification.

The foregoing is illustrative of embodiments and is not to be construed as limiting thereof. Although a few embodiments have been described, those skilled in the art will readily appreciate that many modifications are possible in embodiments without materially departing from the novel teachings and/or advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A non-volatile memory device comprising:
a substrate;
a first wordline on the substrate;
an insulating layer on the first wordline;
a second wordline on the insulating layer, wherein the insulating layer is between the first and second wordlines and wherein the first wordline is between the second wordline and the substrate;
a bit pillar extending adjacent the first wordline, the insulating layer, and the second wordline in a direction perpendicular with respect to a surface of the substrate, wherein the bit pillar is electrically conductive;
a first memory cell comprising a first resistance changeable element electrically coupled between the first wordline and the bit pillar, wherein the first memory cell further comprises a first diode element electrically coupled in series with the first resistance changeable element between the first wordline and the bit pillar, and wherein the first diode element comprises a first metal silicide layer and a first silicon layer; and
a second memory cell comprising a second resistance changeable element electrically coupled between the second wordline and the bit pillar, wherein the second memory cell further comprises a second diode element electrically coupled in series with the second resistance changeable element between the second wordline and the bit pillar, and wherein the second diode element comprises a second metal silicide layer and a second silicon layer;
wherein the bit pillar comprises a semiconductor material adjacent the first and second memory cells having a first dopant concentration, wherein the first silicon layer is electrically coupled between the first metal silicide layer and the semiconductor material of the bit pillar, wherein the second silicon layer electrically coupled between the second metal silicide layer and the semiconductor material of the bit pillar, and wherein the first and second silicon layers have a second dopant concentration that is less than the first dopant concentration.

2. The non-volatile memory device according to claim 1 wherein the bit pillar includes a first recess adjacent the first wordline and a second recess adjacent the second wordline, and wherein the first silicon layer extends into the first recess, and wherein the second silicon layer extends into the second recess.

3. The non-volatile memory device of claim 1 wherein the insulating layer comprises a first insulating layer, the non-volatile memory device further comprising:
a second insulating layer on the second wordline, wherein the second wordline is between the first and second insulating layers, and wherein the second metal silicide layer is confined between the first and second insulating layers.

4. The non-volatile memory device of claim 1 wherein the insulating layer comprises a first insulating layer, the non-volatile memory device further comprising:
a second insulating layer on the second wordline, wherein the second wordline is between the first and second insulating layers, and wherein the second silicon layer is confined between the first and second insulating layers.

5. A non-volatile memory device comprising:
a substrate;
a first wordline on the substrate;
an insulating layer on the first wordline;
a second wordline on the insulating layer, wherein the insulating layer is between the first and second wordlines and wherein the first wordline is between the second wordline and the substrate;
a bit pillar extending adjacent the first wordline, the insulating layer, and the second wordline in a direction perpendicular with respect to a surface of the substrate, wherein the bit pillar is electrically conductive, and wherein the bit pillar comprises a semiconductor material having a first dopant concentration;
a first memory cell comprising a first resistance changeable element and a first diode element electrically coupled in series between the first wordline and the bit pillar, wherein the first diode element comprises a first metal silicide layer; and a second memory cell comprising a second resistance changeable element and a second diode element electrically coupled in series between the second wordline and the bit pillar, wherein the second diode element comprises a second metal silicide layer; and a silicon layer surrounding the semiconductor material of the bit pillar adjacent the first and second memory cells, wherein the silicon layer has a second dopant concentration that is less than the first dopant concentration, wherein the first metal silicide layer and the first resistance changeable element are electrically coupled in series between the silicon layer and the first wordline, and wherein the second metal silicide layer and the second resistance changeable element are electrically coupled in series between the silicon layer and the second wordline.

6. The non-volatile memory device of claim 1, wherein the first memory cell further comprises a first metal oxide electrode between the first resistance changeable element and the first metal silicide layer, wherein the second memory cell further comprises a second metal oxide electrode between the second resistance changeable element and the second metal silicide layer, and wherein the first and second metal silicide layers and the first and second metal oxide electrodes comprise a same metal.

7. The non-volatile memory device of claim 1 wherein each of the first and second wordlines comprises Ruthenium (Ru) and/or Tungsten (W).

8. The non-volatile memory device of claim 1 wherein each of the first and second resistance changeable elements comprises a transition metal oxide, a phase change material, a solid electrolyte, and/or a polymer.

9. The non-volatile memory device of claim 1 wherein the first resistance changeable element comprises a portion of a first resistance changeable element layer that extends between the first wordline and the substrate and between the first wordline and the insulating layer, and wherein the second resistance changeable element comprises a portion of a second resistance changeable element layer that extends between the second wordline and the insulating layer.

10. The non-volatile memory device of claim 1 wherein the bit pillar comprises a metal bit pillar core surrounded by a layer of an electrically conductive semiconductor material.

11. A non-volatile memory device comprising:
a substrate;
a first wordline on the substrate;
an insulating layer on the first wordline;
a second wordline on the insulating layer, wherein the insulating layer is between the first and second wordlines and wherein the first wordline is between the second wordline and the substrate;
a bit pillar extending adjacent the first wordline, the insulating layer, and the second wordline in a direction perpendicular with respect to a surface of the substrate, wherein the bit pillar is electrically conductive wherein the bit pillar comprises an electrically conductive semiconductor material having first dopant concentration;
a first memory cell comprising a first resistance changeable element electrically coupled between the first wordline and the bit pillar wherein the first memory cell further comprises a first semiconductor layer having a second dopant concentration less than the first dopant concentration and a first metal silicide layer with the first semiconductor layer between the bit pillar and the first metal silicide layer and with the first resistance changeable element between the first metal silicide layer and the first wordline; and a second memory cell comprising a second resistance changeable element electrically coupled between the second wordline and the bit pillar wherein the second memory cell further comprises a second semiconductor layer having the second dopant concentration less than the first dopant concentration and a second metal silicide layer with the second semiconductor layer between the bit pillar and the second metal silicide layer and with the second resistance changeable element between the second metal silicide layer and the second wordline.

12. The non-volatile memory device of claim 11 wherein the first and second semiconductor layers comprise first and second intrinsic semiconductor layers.

13. The non-volatile memory device of claim 1 wherein the insulating layer comprises a first insulating layer, the non-volatile memory device further comprising:
a third wordline on the substrate, wherein the third wordline is adjacent the bit pillar;
a second insulating layer on the third wordline;
a fourth wordline on the second insulating layer, wherein the second insulating layer is between the third and fourth wordlines, wherein the third wordline is between the fourth wordline and the substrate, and wherein the fourth wordline is adjacent the bit pillar;
an insulating barrier extending from opposite sides of the bit pillar, wherein the insulating barrier and the bit pillar are between the first and third wordlines, and wherein the insulating barrier and the bit pillar are between the second and fourth wordlines;
a third memory cell comprising a third resistance changeable element electrically coupled between the third wordline and the bit pillar; and
a fourth memory cell comprising a fourth resistance changeable element electrically coupled between the fourth wordline and the bit pillar.

14. A non-volatile memory device comprising:
a substrate;
a first semiconductor wordline on the substrate wherein the first semiconductor wordline has a first dopant concentration;
an insulating layer on the first semiconductor wordline;
a second semiconductor wordline on the insulating layer wherein the second semiconductor wordline has the first dopant concentration, wherein the insulating layer is between the first and second semiconductor wordlines and wherein the first semiconductor wordline is between the second semiconductor wordline and the substrate;
a bit pillar extending adjacent the first semiconductor wordline, the insulating layer, and the second semiconductor wordline in a direction perpendicular with respect to a surface of the substrate, wherein the bit pillar is electrically conductive;
a first memory cell comprising a first resistance changeable element electrically coupled between the first semiconductor wordline and the bit pillar wherein the first memory cell further comprises a first diode element including a first semiconductor layer having a second dopant concentration less than the first dopant concentration and a first metal silicide layer, with the first resistance changeable element between the first metal silicide layer and the bit pillar, and with the first semiconductor layer between the metal silicide layer and the first semiconductor wordline; and
a second memory cell comprising a second resistance changeable element electrically coupled between the second semiconductor wordline and the bit pillar wherein the second memory cell further comprises a second diode element including a second semiconductor layer having the second dopant concentration less than the first dopant concentration and a second metal silicide layer, with the second resistance changeable element between the second metal silicide layer and the bit pillar, and with the second semiconductor layer between the second metal silicide layer and the second semiconductor wordline.

15. The non-volatile memory device of claim 14 wherein the first semiconductor wordline comprises a first polysilicon wordline and wherein the second semiconductor wordline comprises a second polysilicon wordline.

16. The non-volatile memory device of claim 1 wherein the first and second wordlines extend in a first direction that is parallel with respect a surface of the substrate, the non-volatile memory device further comprising:
   a bitline extending in a second direction that is parallel with respect to the surface of the substrate, wherein the second direction is different than the first direction, and wherein the bitline is electrically coupled to the bit pillar.

17. An electronic system comprising:
   a microprocessor; and
   a non-volatile memory device electrically coupled with the microprocessor, the non-volatile memory device comprising,
   a substrate;
   a first wordline on the substrate;
   an insulating layer on the first wordline;
   a second wordline on the insulating layer, wherein the insulating layer is between the first and second wordlines and wherein the first wordline is between the second wordline and the substrate;
   a bit pillar extending adjacent the first wordline, the insulating layer, and the second wordline in a direction perpendicular with respect to a surface of the substrate, wherein the bit pillar is electrically conductive, wherein the bit pillar comprises a semiconductor material adjacent the first and second wordlines, and wherein the semiconductor material of the bit pillar has a first dopant concentration;
   a first memory cell comprising a first resistance changeable element, a first metal silicide layer, and a first semiconductor layer electrically coupled in series between the first wordline and the semiconductor material of the bit pillar, wherein the first semiconductor layer has a second dopant concentration different than the first dopant concentration; and
   a second memory cell comprising a second resistance changeable element, a second metal silicide layer, and a second semiconductor layer electrically coupled in series between the second wordline and the semiconductor material of the bit pillar, wherein the second semiconductor layer has the second dopant concentration different than the first dopant concentration.

18. The electronic system of claim 17 wherein the second dopant concentration is less than the first dopant concentration.

19. The electronic system of claim 17 wherein the first metal silicide layer and the first semiconductor layer define a first diode element, and wherein the second metal silicide layer and the second semiconductor layer define a second diode element.

20. The electronic system of claim 17 wherein the bit pillar includes a first recess adjacent the first wordline and a second recess adjacent the second wordline, and wherein the first semiconductor layer extends into the first recess, and wherein the second semiconductor layer extends into the second recess.

* * * * *